(12) United States Patent
Her et al.

(10) Patent No.: US 10,643,724 B2
(45) Date of Patent: May 5, 2020

(54) STORAGE DEVICE AND OPERATING METHOD THEREOF

(71) Applicant: SK hynix Inc., Gyeonggi-do (KR)

(72) Inventors: Min Ho Her, Chungcheongbuk-do (KR); Dong Hyun Kim, Gyeonggi-do (KR); Seung Il Kim, Chungcheongbuk-do (KR); Youn Ho Jung, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/353,766

(22) Filed: Mar. 14, 2019

(65) Prior Publication Data

US 2020/0051649 A1    Feb. 13, 2020

(30) Foreign Application Priority Data

Aug. 7, 2018    (KR) .......................... 10-2018-0092035

(51) Int. Cl.
*G11C 16/34*    (2006.01)
*G11C 16/30*    (2006.01)

(52) U.S. Cl.
CPC .......... *G11C 16/3463* (2013.01); *G11C 16/30* (2013.01); *G11C 16/34* (2013.01)

(58) Field of Classification Search
None
See application file for complete search history.

(56) References Cited

U.S. PATENT DOCUMENTS

| | | | |
|---|---|---|---|
| 8,422,305 B2* | 4/2013 | Lee | G11C 16/3404 365/185.09 |
| 2009/0316483 A1* | 12/2009 | Kim | G11C 11/5628 365/185.09 |
| 2011/0063918 A1* | 3/2011 | Pei | G06F 11/1072 365/185.18 |

FOREIGN PATENT DOCUMENTS

| KR | 10-2007-0104957 | 10/2007 |
|---|---|---|
| KR | 10-2014-0048392 | 4/2014 |
| KR | 10-2016-0090436 | 8/2016 |
| KR | 10-2017-0011641 | 2/2017 |

* cited by examiner

*Primary Examiner* — Tan T. Nguyen
(74) *Attorney, Agent, or Firm* — IP & T Group LLP

(57) ABSTRACT

In a memory device having improved reliability, the memory device includes: a memory cell array including memory cells; a program operation controller configured to perform a program operation on the memory cells to any one state among first to nth states; a voltage generator configured to generate operating voltages respectively corresponding to the first to nth states in the program operation; a verify operation controller configured to verify whether the program operation performed on selected memory cells to a kth state, has been completed, and count a number of over-programmed memory cells having a threshold voltage greater than a threshold voltage corresponding to the kth state among the selected memory cells; and an over-program manager configured to increase operating voltages corresponding to (k+1)th to nth states to be greater than default values according to the number of over-programmed memory cells.

20 Claims, 18 Drawing Sheets

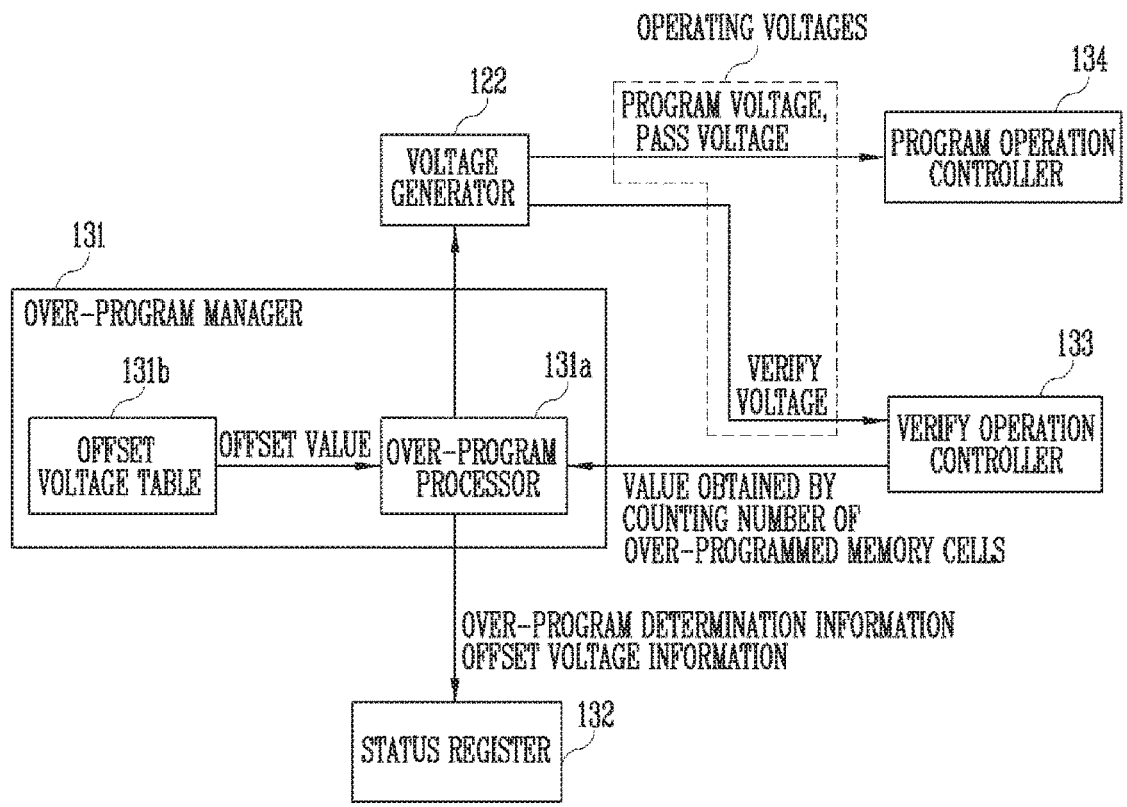

STORAGE DEVICE AND OPERATING METHOD THEREOF

CROSS-REFERENCE TO RELATED APPLICATION

The present application claims priority under 35 U.S.C. § 119(a) to Korean patent application number 10-2018-0092035, filed on Aug. 7, 2018, the disclosure of which is incorporated herein by reference in its entirety.

BACKGROUND

Field of Invention

The present disclosure generally relates to an electronic device, and more particularly, to a storage device and an operating method thereof.

Description of Related Art

A storage device stores data under the control of a host device such as a computer or a smart phone. The storage device may include a memory device for storing data and a memory controller for controlling the memory device. The memory device may be a volatile memory device or a nonvolatile memory device.

In a volatile memory device stored data is retained only when power is supplied; stored data is lost when the supply of power is interrupted. The volatile memory device may be any of a static random access memory (SRAM), a dynamic random access memory (DRAM), and the like.

In a nonvolatile memory device stored data is retained even when the supply of power is interrupted. The nonvolatile memory device may be any of a read only memory (ROM), a programmable ROM (PROM), an electrically programmable ROM (EPROM), an electrically erasable ROM (EEROM), a flash memory, and the like.

SUMMARY

Embodiments provide a storage device having improved reliability and an operating method thereof.

In accordance with an aspect of the present disclosure, there is provided a memory device comprising: a memory cell array including memory cells; a program operation controller configured to perform a program operation on the memory cells to any one state among first to nth states, wherein n is a natural number greater than 1, distinguished according to their threshold voltages; a voltage generator configured to generate operating voltages respectively corresponding to the first to nth states in the program operation; a verify operation controller configured to verify whether the program operation performed on selected memory cells to a kth state, wherein k is a natural number less than n, has been completed, and count a number of over-programmed memory cells having a threshold voltage greater than a threshold voltage corresponding to the kth state among the selected memory cells; and an over-program manager configured to increase operating voltages respectively corresponding to (k+1)th to nth states to be greater than respectively corresponding default values according to the number of over-programmed memory cells.

In accordance with another aspect of the present disclosure, there is provided a storage device comprising: a memory device configured to increase voltages used in a program operation and a verify operation on memory cells in (k+1)th to nth states, wherein n is a natural number greater than 1 and k is a natural number less than n, according to a number of over-programmed cells having a threshold voltage greater than a threshold voltage corresponding to a kth state, among selected memory cells programmed to the kth state; and a memory controller configured to process a memory block including the selected memory cells as a bad block, when the number of over-programmed memory cells exceeds a reference number.

In accordance with still another aspect of the present disclosure, there is provided a method for operating a memory device including a plurality of memory blocks each including a plurality of memory cells, the method comprising: performing a program operation on selected memory cells to a kth state, among first to nth states, wherein k is a natural number less than n and n is a natural number greater than 1; generating operating voltages respectively corresponding to the first to nth states in the program operation; performing a verify operation on the selected memory cells; when the verify operation passes, counting a number of over-programmed memory cells having a threshold voltage greater than a threshold voltage corresponding to the kth state; and increasing operating voltages respectively corresponding to (k+1)th to nth states, among the operating voltages, to be greater than respective default values according to the number of over-programmed memory cells.

In accordance with still another aspect of the present disclosure, there is provided a storage device comprising: a memory device including a plurality of memory cells, a voltage generator suitable for generating operating voltages respectively corresponding to program states, and control logic; and a memory controller, wherein the control logic is configured to: control a program operation on select memory cells, among the plurality of memory cells, to have a select state among the program states; detect over-programmed memory cells, among the select memory cells, through a program verify operation; control the voltage generator to generate an increased operating voltage for at least one other state among the program states based on the number of over-programmed memory cells detected, a threshold voltage corresponding to the at least one other state being greater than a threshold voltage corresponding to the select state; and provide the memory controller with over-program determination information regarding the over-programmed memory cells, wherein the memory controller is configured to receive the over-program determination information, and process a memory block including at least some of the over-programmed memory cells as a bad block based on the over-program determination information.

BRIEF DESCRIPTION OF THE DRAWINGS

Various embodiments will now be described more fully with reference to the accompanying drawings; however, elements and features may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout. Also, throughout the specification, reference to "an embodiment,"

"another embodiment," or the like is not necessarily to only one embodiment, and different references to any such phrase are not necessarily to the same embodiment(s).

Figure 1:
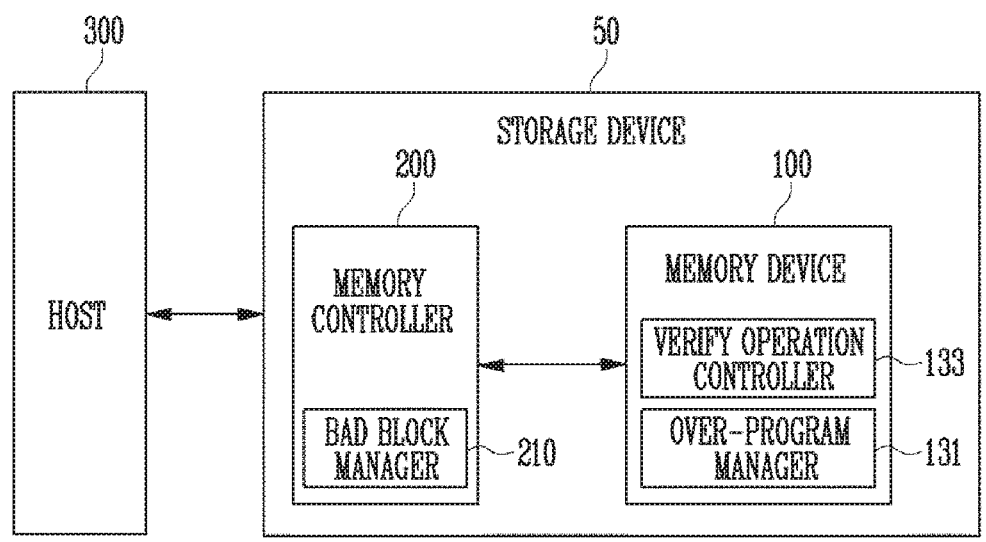

FIG. 1 is a diagram illustrating a storage device in accordance with an embodiment of the present disclosure.

Figure 2:
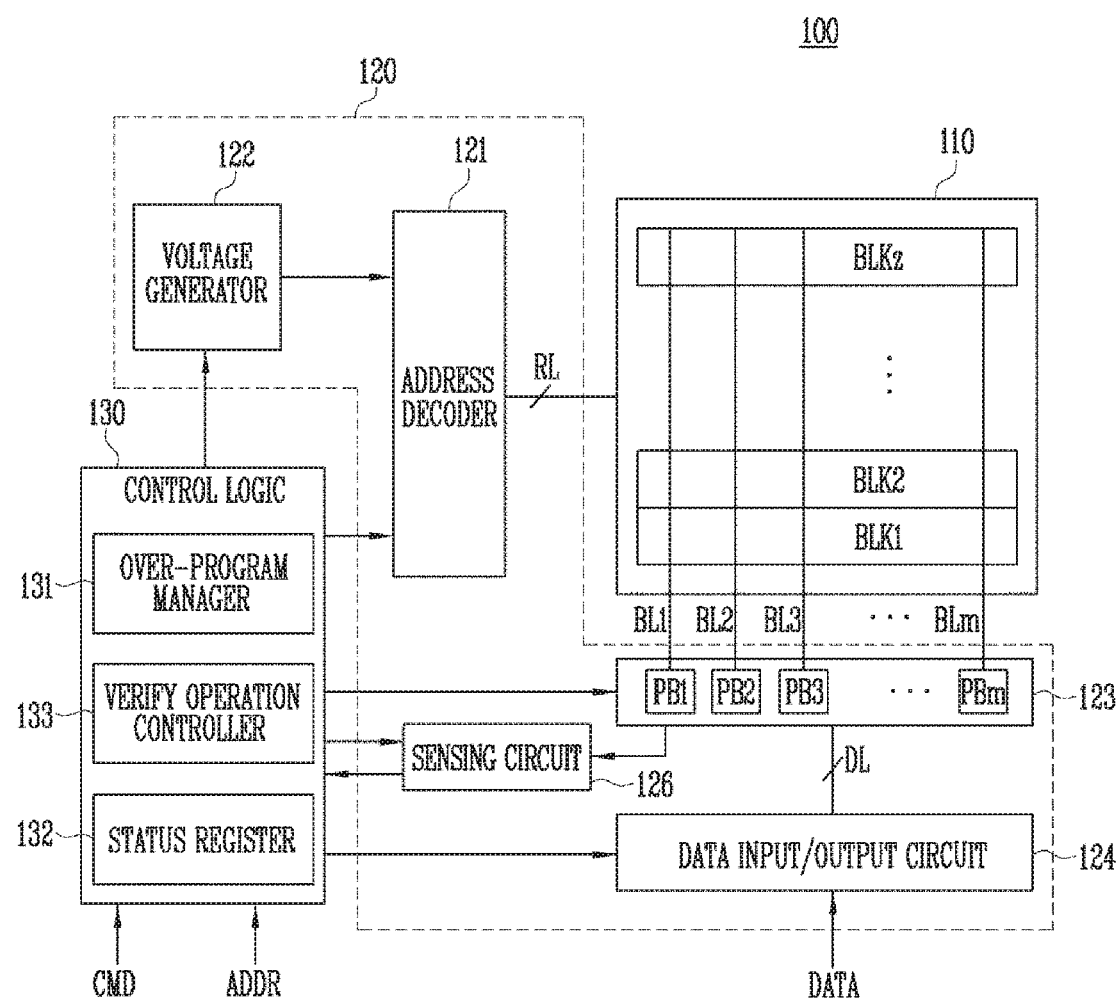

FIG. 2 is a diagram illustrating a structure of a memory device in accordance with an embodiment of the present disclosure.

Figure 3:
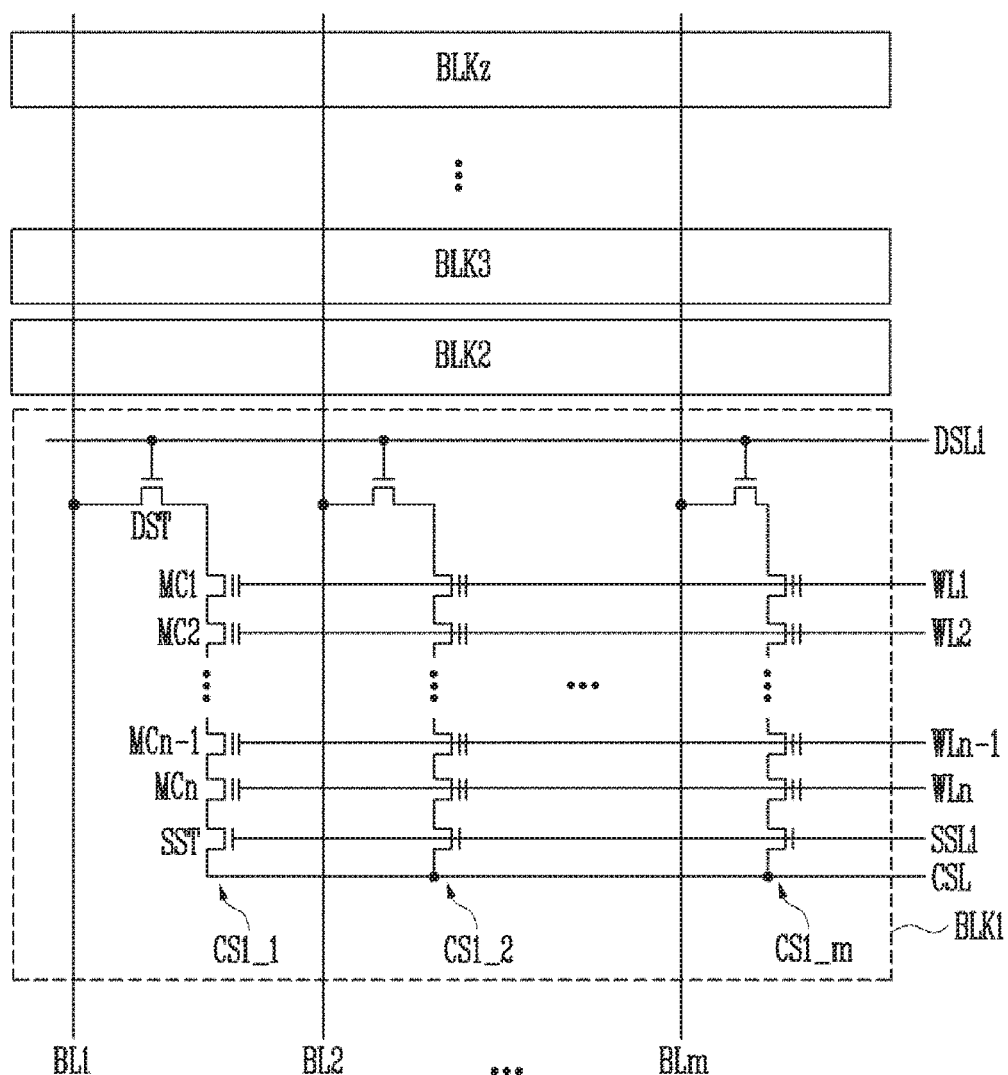

FIG. 3 is a diagram illustrating a memory cell array in accordance with an embodiment of the present disclosure.

Figure 4:
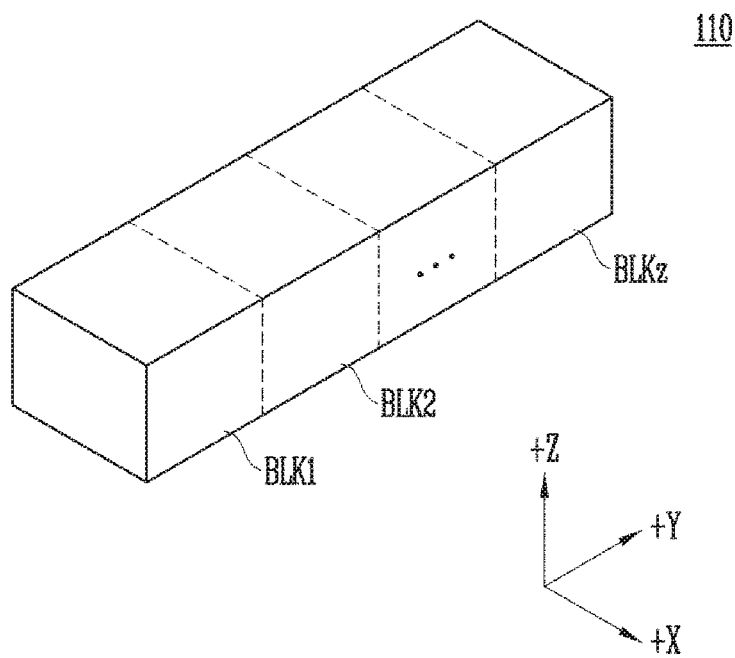

FIG. 4 is a diagram illustrating a memory cell array in accordance with an embodiment of the present disclosure.

Figure 5:
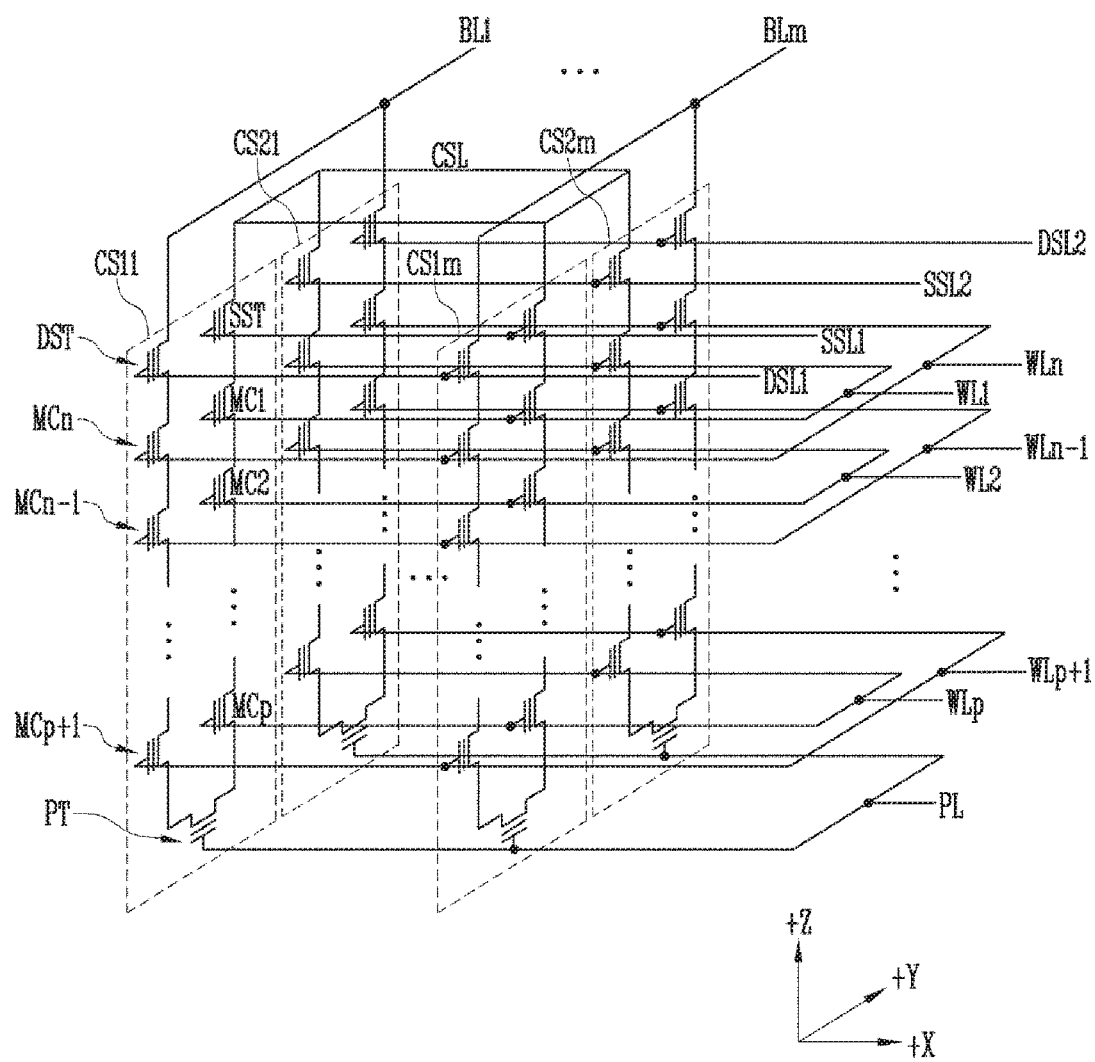

FIG. 5 is a circuit diagram illustrating any one memory block among memory blocks in accordance with an embodiment of the present disclosure.

Figure 6:
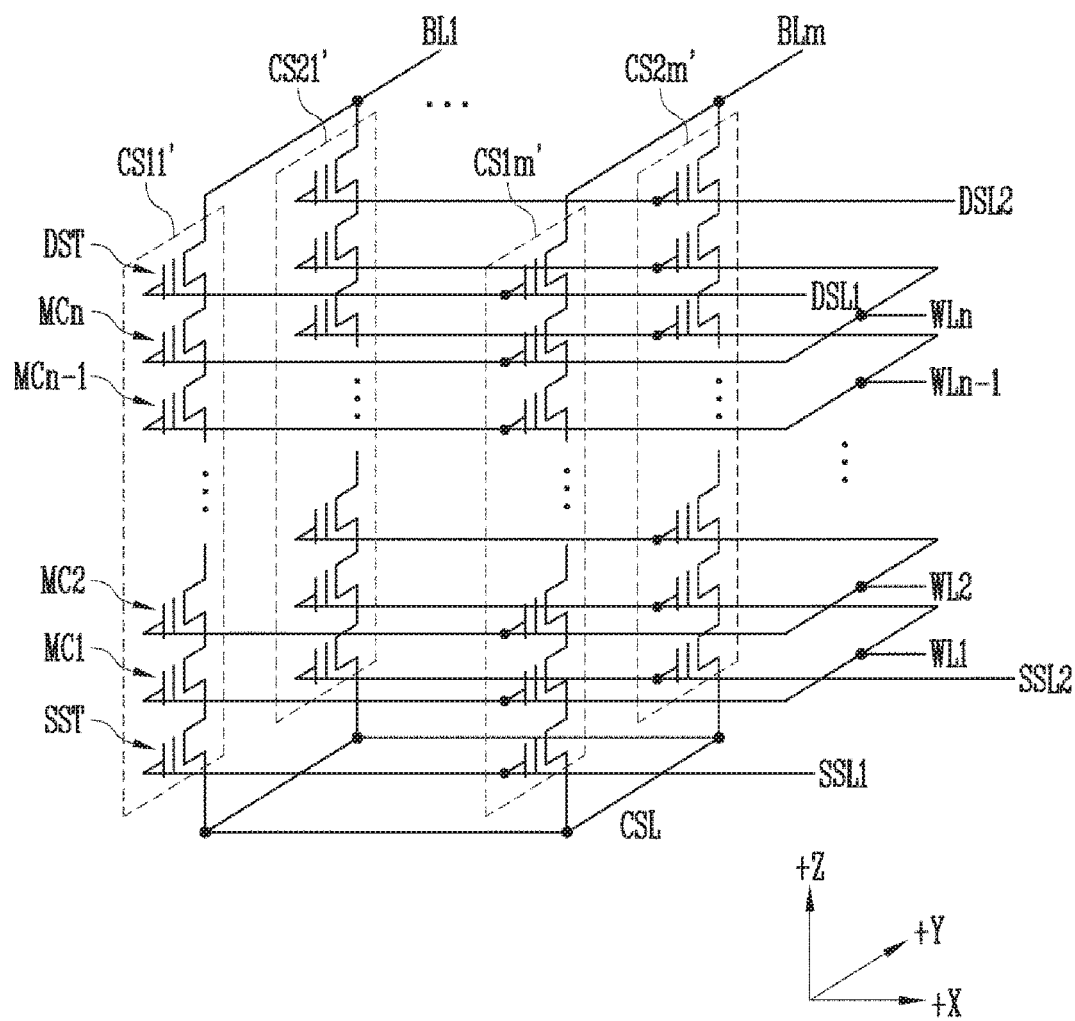

FIG. 6 is a circuit diagram illustrating any one memory block among memory blocks in accordance with an embodiment of the present disclosure.

Figure 7:
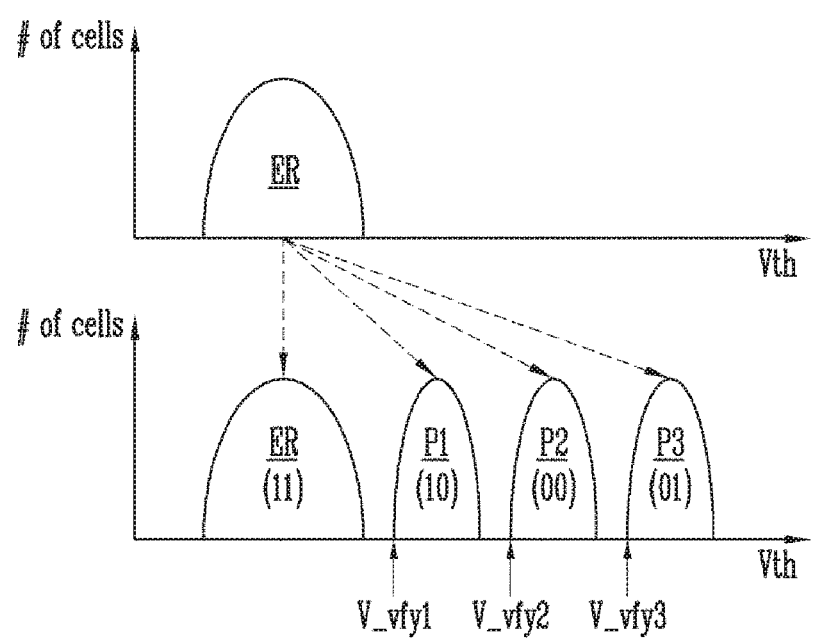

FIG. 7 is a diagram illustrating a threshold voltage distribution of memory cells, which is formed by a program operation.

Figure 8:
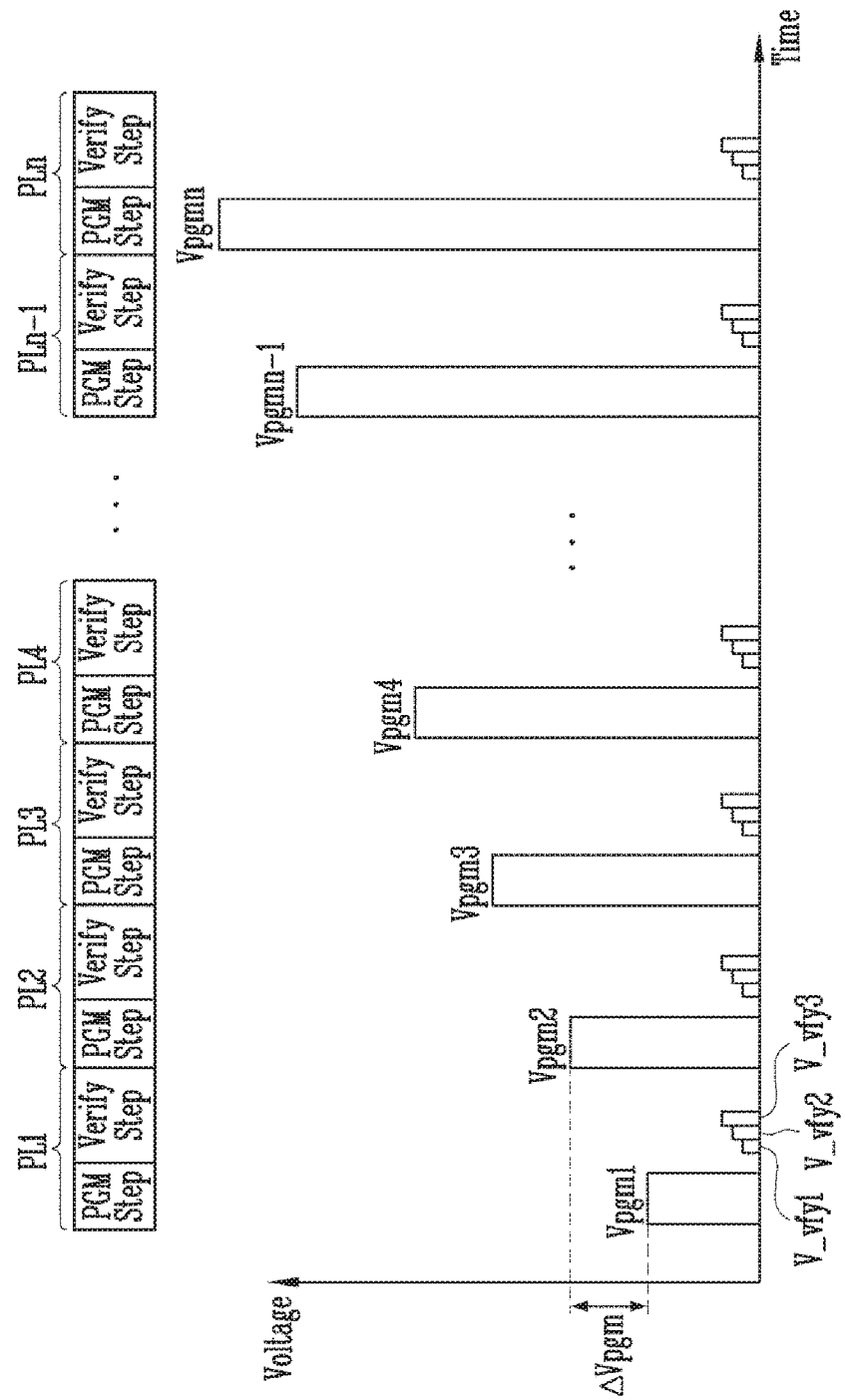

FIG. 8 is a diagram illustrating a program operation of a memory device.

Figure 9:
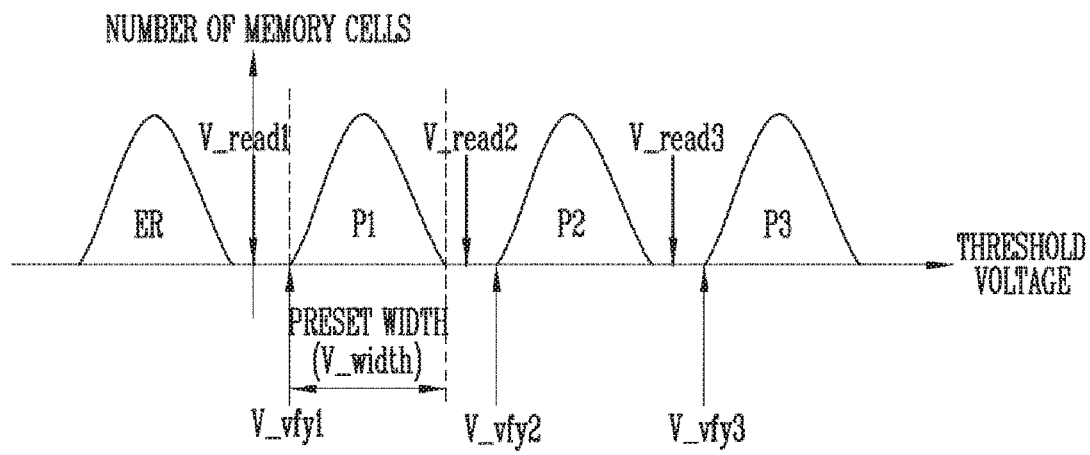

FIG. 9 is a diagram illustrating a threshold voltage distribution of a normal program state.

Figure 10:
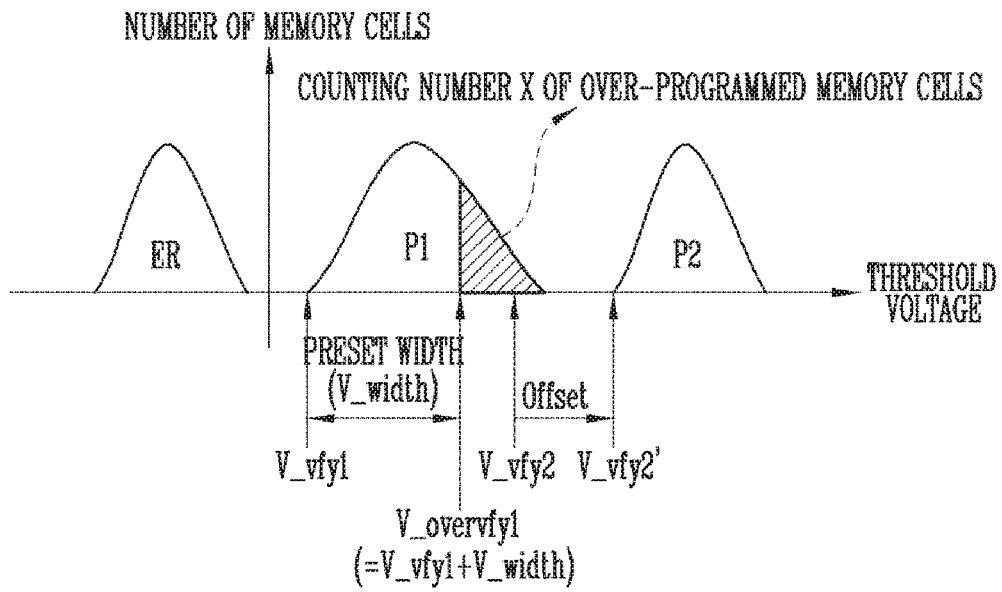

FIG. 10 is a diagram illustrating a method for determining whether an over-program operation has been performed and controlling operating voltages corresponding to a program state.

FIG. 11 is a diagram illustrating an operation of an over-program manager of a memory device in accordance with an embodiment of the present disclosure.

FIG. 12 is a diagram illustrating an offset voltage table in accordance with an embodiment of the present disclosure.

Figure 13:
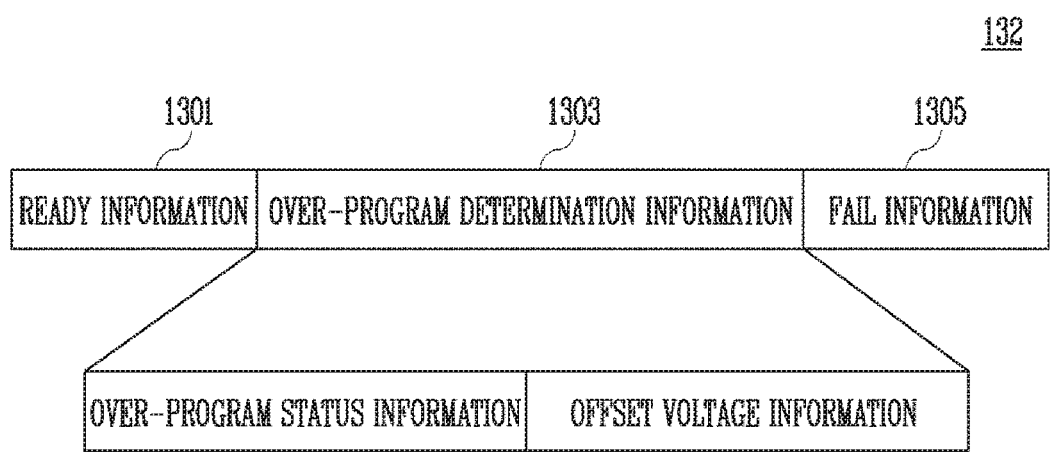

FIG. 13 is a diagram illustrating a status register in accordance with an embodiment of the present disclosure.

Figure 14:
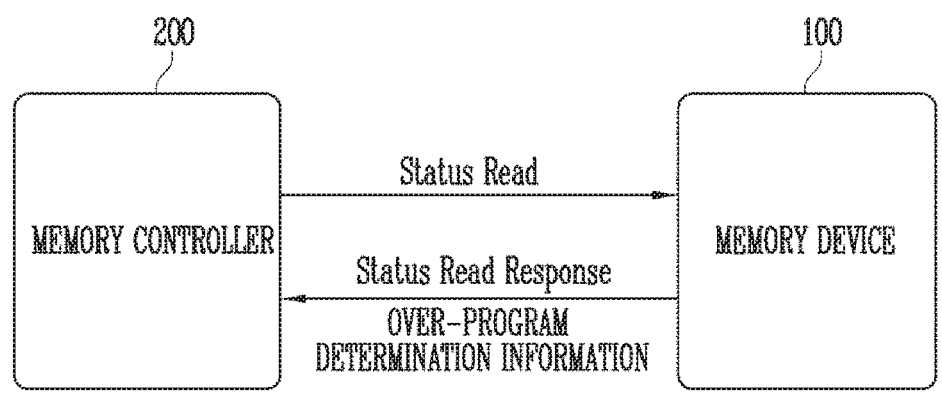

FIG. 14 is a diagram illustrating a method for acquiring over-program determination information in accordance with an embodiment of the present disclosure.

Figure 15:
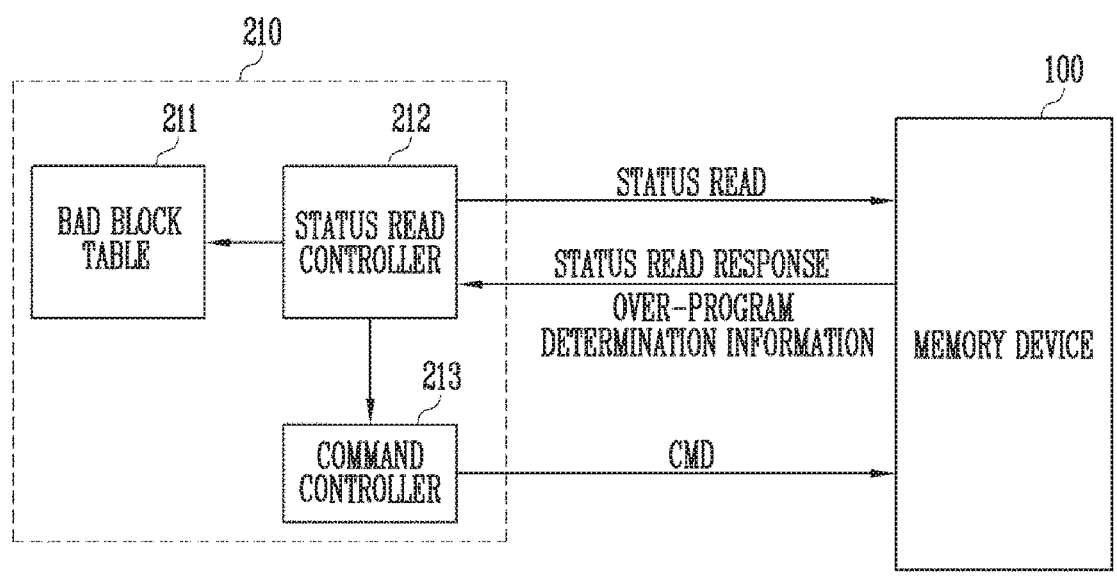

FIG. 15 is a diagram illustrating an operation of a bad block manager of a memory controller in accordance with an embodiment of the present disclosure.

Figure 16:
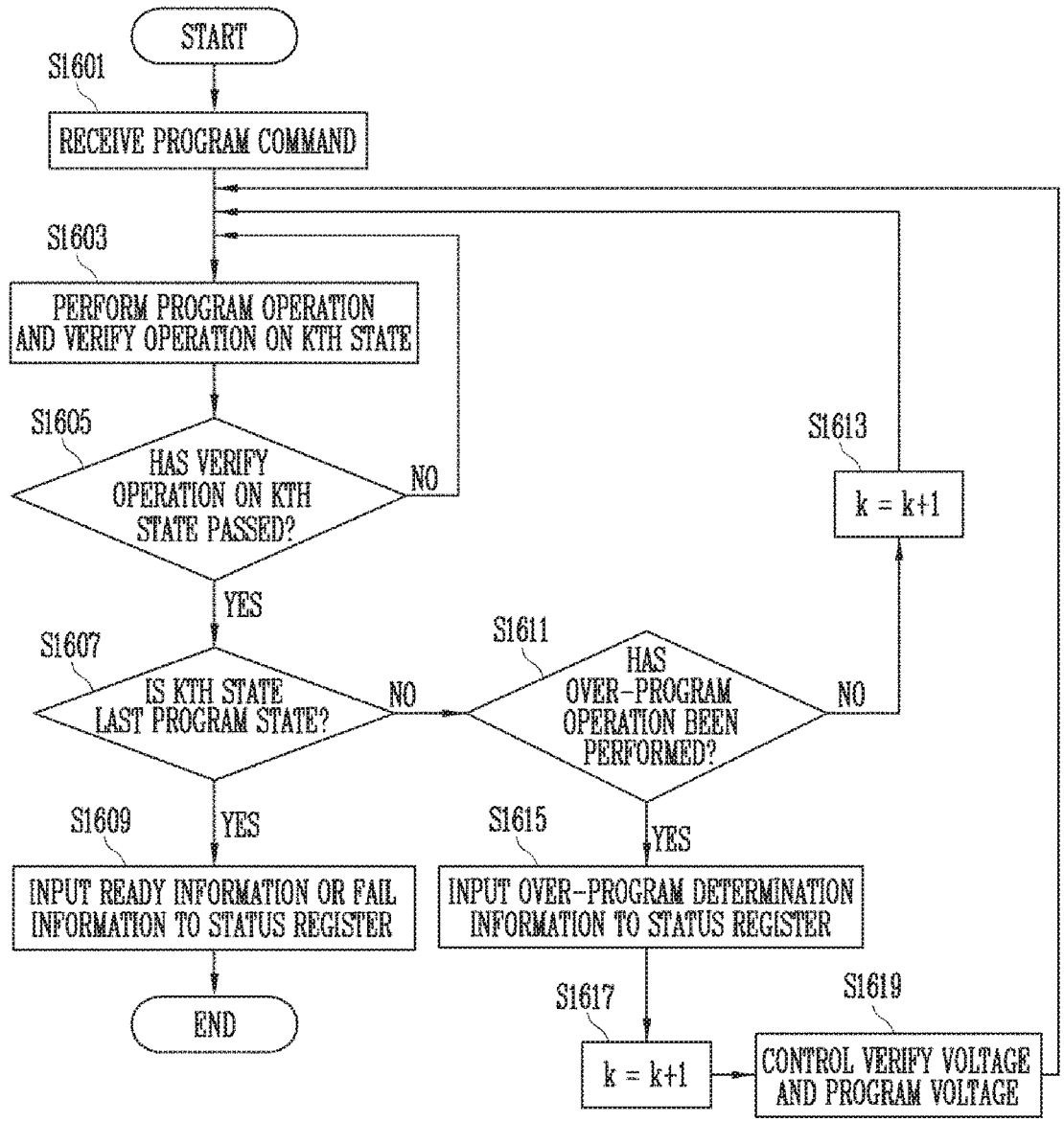

FIG. 16 is a flowchart illustrating an operation of a memory device in accordance with an embodiment of the present disclosure.

Figure 17:
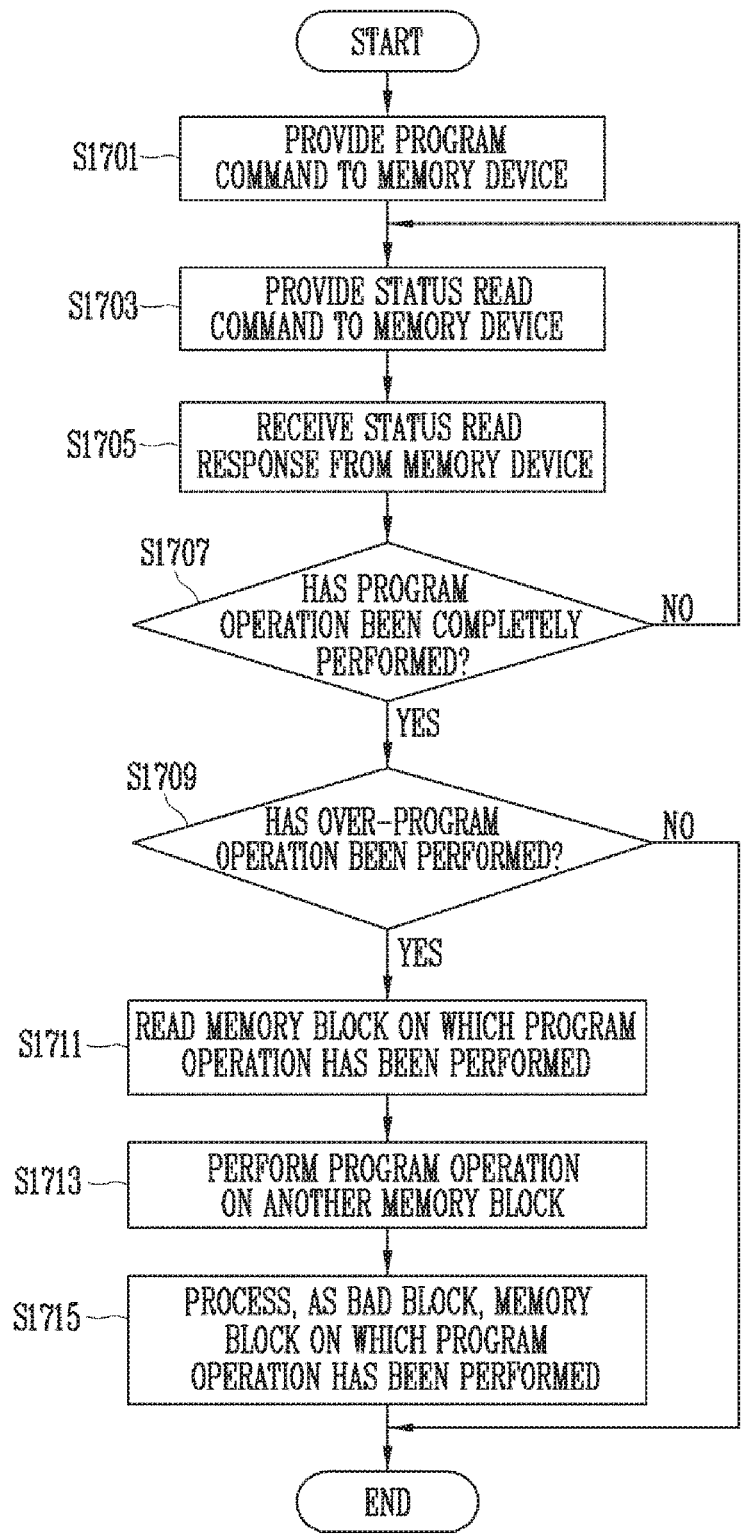

FIG. 17 is a flowchart illustrating an operation of a memory controller in accordance with an embodiment of the present disclosure.

Figure 18:
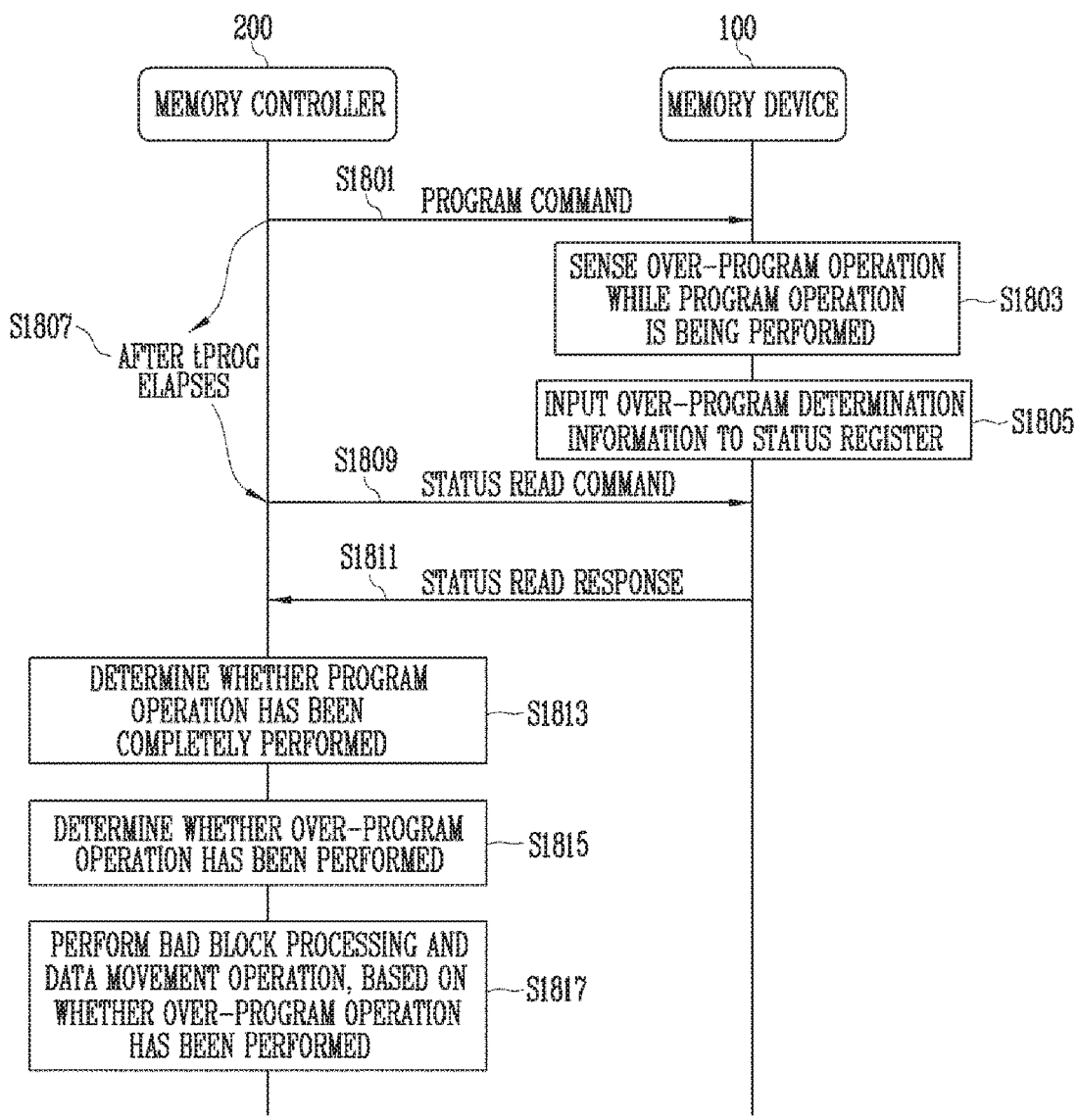

FIG. 18 is a flowchart illustrating an operation of a storage device in accordance with an embodiment of the present disclosure.

Figure 19:
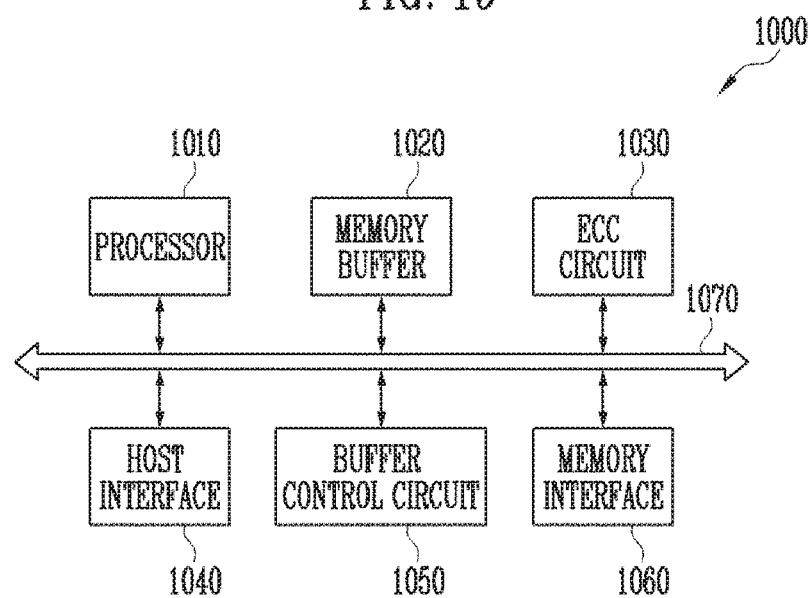

FIG. 19 is a diagram illustrating a memory controller in accordance with an embodiment of the present disclosure.

Figure 20:
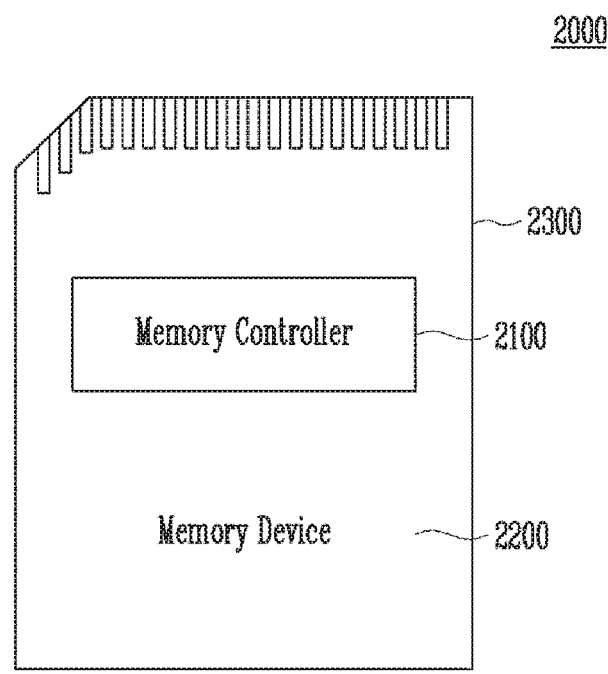

FIG. 20 is a block diagram illustrating a memory card system to which a storage device is applied in accordance with an embodiment of the present disclosure.

Figure 21:
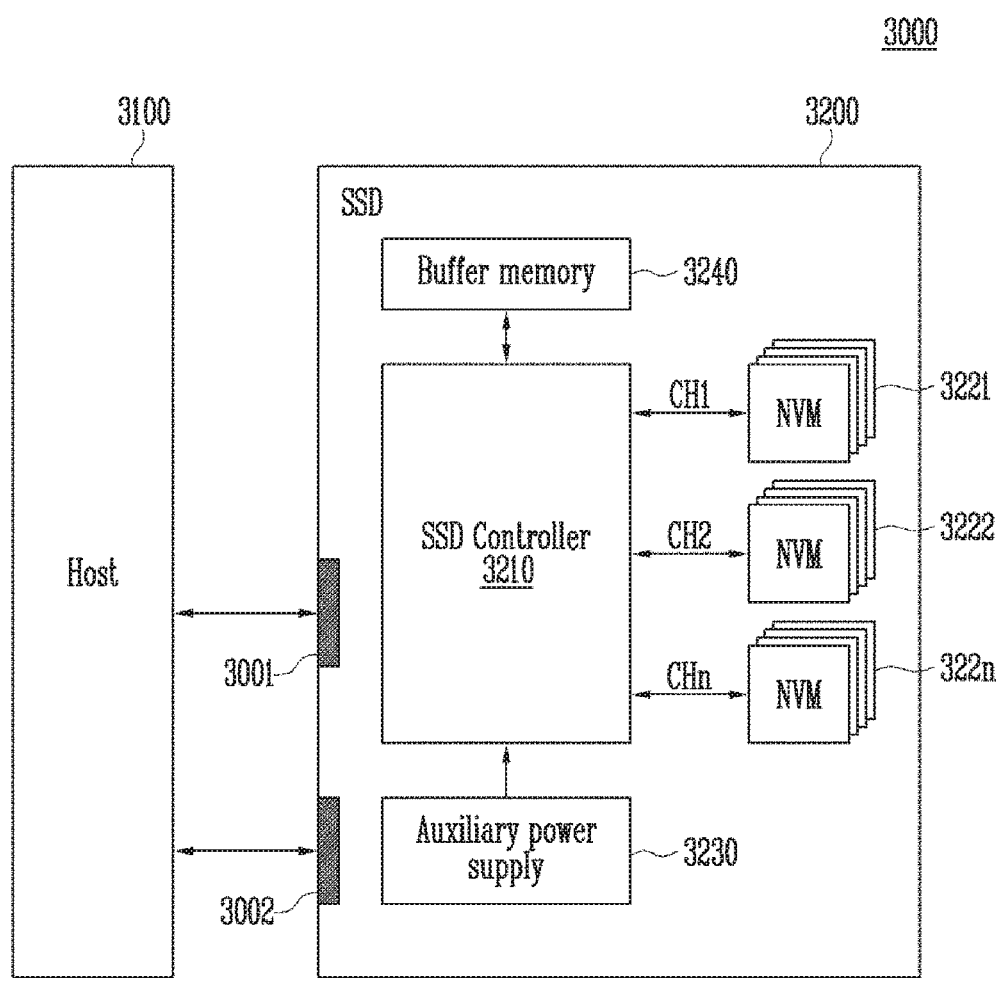

FIG. 21 is a block diagram illustrating a solid state drive (SSD) to which a storage device is applied in accordance with an embodiment of the present disclosure.

Figure 22:
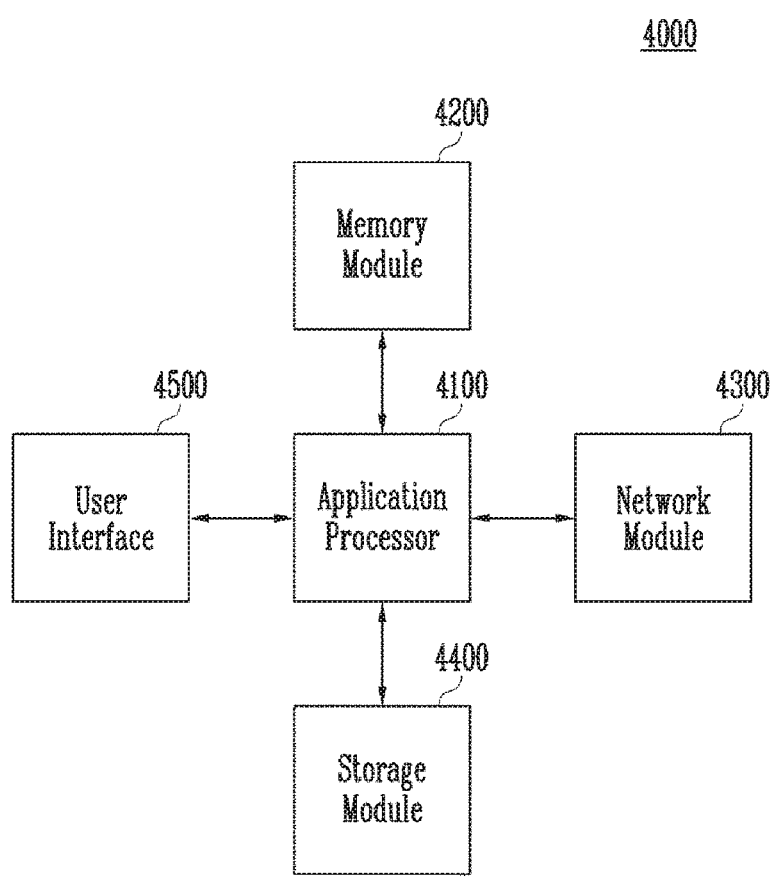

FIG. 22 is a block diagram illustrating a user system to which a storage device is applied in accordance with an embodiment of the present disclosure.

DETAILED DESCRIPTION

The specific structural or functional description disclosed herein is for the purpose of describing embodiments in accordance with the concept of the present disclosure. The present invention, however, may be implemented in other ways, which may be modifications or variations of any of the disclosed embodiments. Thus, the present invention is not limited to the embodiments set forth herein.

The present embodiments are described and illustrated in detail. However, the embodiments are not limited to specific detail. Rather, the present invention is intended to include all changes, equivalents, or substitutes that do not depart from the spirit and technical scope of the present disclosure.

While terms such as "first" and "second" may be used to identify various components, such components are not limited by any of the above terms. The above terms are used only to distinguish one component from another that otherwise have the same or similar names. For example, a first component in one instance may be referred to as a second component in another instance without departing from the scope of rights of the present disclosure.

It will be understood that when an element is referred to as being "connected" or "coupled" to another element, it can be directly connected or coupled to the other element or one or more intervening elements may also be present. In contrast, when an element is referred to as being "directly connected" or "directly coupled" to another element, no intervening elements are present. Other expressions describing relationships between components such as "~ between," "immediately ~ between" or "adjacent to ~" and "directly adjacent to ~" may be construed similarly. Communication between two elements, whether directly or indirectly connected/coupled, may be wired or wireless, unless the context indicates otherwise.

The terms used in the present application are merely used to describe particular embodiments, and are not intended to limit the present disclosure. Singular forms in the present disclosure are intended to include the plural forms and vice versa, unless the context clearly indicates otherwise. It will be further understood that terms such as "including" or "having," etc., are intended to indicate the existence of the stated features, numbers, operations, actions, components, parts, or combinations thereof but are not intended to preclude the possibility that one or more other features, numbers, operations, actions, components, parts, or combinations thereof may exist or may be added.

So far as not being differently defined, all terms used herein including technical or scientific terminologies have meanings that are commonly understood by those skilled in the art to which the present disclosure pertains. The terms having the dictionary definitions should be understood such that they have meanings consistent with the context of the related technique. So far as not being clearly defined in this application, terms should not be understood in an ideally or excessively formal way.

In describing embodiments, description of techniques that are well known to the art to which the present disclosure pertains and are not directly related to the present disclosure is omitted. As a result, aspects and features of the present invention are more clearly presented.

Various embodiments of the present disclosure will be described in detail with reference to the accompanying drawings in order for those skilled in the art to be able to readily practice the present invention.

FIG. 1 is a diagram illustrating a storage device 50 in accordance with an embodiment of the present disclosure.

Referring to FIG. 1, the storage device 50 may include a memory device 100 and a memory controller 200.

The memory device 100 may store data. The memory device 100 operates under the control of the memory controller 200. The memory device 100 may include a memory cell array. The memory cell array may include a plurality of memory cells for storing data. In accordance with an embodiment of the present disclosure, the memory cell array may include a plurality of memory blocks. Each memory block may include a plurality of memory cells. In accordance with an embodiment of the present disclosure, one memory block may include a plurality of pages. A page may be a unit for performing a program operation or read operation. A memory block may be a unit for performing an erase operation.

Each of the memory cells of the memory device 100 may be configured as a single level cell (SLC) for storing one data bit, a multi level cell (MLC) for storing two data bits, a triple level cell (TLC) for storing three data bits, or a quad level cell (QLC) for storing four data bits. The memory device 100 may sequentially or randomly store data in a memory block under the control of the memory controller 200. In accordance with an embodiment of the present disclosure, the memory device 100 may be a double data rate synchronous dynamic random access memory (DDR SDRAM), a low power double data rate 4 (LPDDR4) SDRAM, a graphics double data rate (GDDR) SRAM, a low power DDR (LPDDR), a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like.

In accordance with an embodiment of the present disclosure, the memory device 100 may be implemented in a three-dimensional array structure. The present disclosure may be applied to not only a flash memory device in which a charge storage layer is configured with a floating gate (FG) but also a charge trap flash (CTF) in which a charge storage layer is configured with an insulating layer.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (or program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

In a program operation, selected memory cells among the plurality of memory cells included in the memory device 100 may be programmed to have any one state among an erase state and a plurality of program states according to data to be stored. The erase state and the plurality of program states may correspond to first to nth states (where n is a natural number of 1 or more). The selected memory cells may have a target state corresponding to any one of the first to nth states. The target state may be determined according to data to be stored in each memory cell. When the program operation is performed, the selected memory cells may have a threshold voltage distribution corresponding to the target state.

In the program operation, memory cells having a threshold voltage greater than the threshold voltage distribution corresponding to the target state among the selected memory cells may be over-programmed memory cells.

The memory device 100 may further include an over-program manager 131 and a verify operation controller 133.

In accordance with an embodiment of the present disclosure, the over-program manager 131 may set operating voltages used in a program operation and a verify operation based on the number of over-programmed memory cells. For example, when the number of over-programmed memory cells among memory cells having a kth state (where k is a natural number less than n) as the target state exceeds a reference number, the over-program manager 131 may set operating voltages corresponding to a (k+1)th state. The operating voltages may include at least one of a program voltage, a verify voltage, and a pass voltage.

In accordance with various embodiments of the present disclosure, the over-program manager 131 may generate over-program determination information by comparing the number of over-programmed memory cells among the memory cells having the kth state as the target state with the reference number.

The over-program determination information may include over-program status information and offset voltage information. The over-program status information may represent whether the number of over-programmed memory cell exceeds the reference number. The over-program status information may represent whether an over-program operation on the kth state has been performed. When the number of over-programmed memory cells in a program operation on the kth state exceeds the reference number, the over-program manager 131 may determine that the over-program operation on the kth state has been performed.

The offset voltage information may represent an offset value of each of the operating voltages corresponding to program states corresponding to a threshold voltage distribution greater than that corresponding to the kth state according to the number of over-programmed memory cells among the memory cells having the kth state as the target state. The offset value may represent a width shifted from a default value of an operating voltage.

In accordance with an embodiment of the present disclosure, the verify operation controller 133 may verify whether a program operation on the kth state among the plurality of program states has been completed based on the magnitude of a threshold voltage of memory cells programmed to the kth state. The verify operation controller 133 may count a number of over-programmed memory cells that are memory cells having a threshold voltage greater than the threshold voltage distribution on the kth state among the memory cells programmed to the kth state. The verify operation controller 133 may provide the counted number of over-programmed memory cells to the over-program manager 131.

The memory device 100 may provide the over-program determination information to the memory controller 200 in response to a request of the memory controller 200.

The memory controller 200 may control overall operations of the memory device 100. The memory controller 200 may control an operation of the memory device 100 in response to a request from a host 300 or in the absence of a request from the host 300.

For example, the memory controller 200 may control the memory device 100 to perform a program operation, a read operation, an erase operation, or the like in response to a request from the host 300. In the program operation, the memory controller 200 may provide a program command, a physical address, and data to the memory device 100. In the read operation, the memory controller 200 may provide a read command and a physical address to the memory device 100. In the erase operation, the memory controller 200 may provide an erase command and a physical address to the memory device 100.

In accordance with an embodiment of the present disclosure, the memory controller 200 may autonomously generate a program command, an address, and data without any request from the host 300, and transmit the program command, the address, and the data to the memory device 100. For example, the memory controller 200 may provide the command, the address, and the data to the memory device 100 to perform background operations such as a program operation for wear leveling and a program operation for garbage collection.

The memory controller 200 may execute firmware (FW) for controlling the memory device 100. When the memory device 100 is a flash memory device, the memory controller 200 may be configured to operate firmware such as a flash translation layer (FTL) for controlling communication between the host 300 and the memory device 100. Specifically, the memory controller 200 may translate a logical address included in a request from the host 300 into a physical address.

The memory controller 200 may further include a bad block manager 210.

The bad block manager 210 may acquire over-program determination information from the memory device 100. For example, the bad block manager 210 may provide a status read command to the memory device 100, and receive status information from the memory device 100 in response to the status read command. The over-program determination information may be included in the status information received from the memory device 100.

The bad block manager 210 may set a memory block including over-programmed memory cells as a bad block according to the over-program determination information. Specifically, when an over-program operation is performed while a program operation on selected memory cells is being performed, the bad block manager 210 may set a memory block including the selected memory cells as a bad block.

The bad block manager 210 may move data stored in a memory block including over-programmed memory cells to another memory block and then set the corresponding memory block as a bad block. In accordance with an embodiment of the present disclosure, the bad block manager 210 may read data, based on the over-program determination information, and store the read data in another memory block.

The host 300 may communicate with the storage device 50 using at least one of various communication protocols, such as a universal serial bus (USB), a serial AT attachment (SATA), a high speed interchip (HSIC), a small computer system interface (SCSI), Firewire, a peripheral component interconnection (PCI), a PCI express (PCIe), a non-volatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

FIG. 2 is a diagram illustrating a structure of a memory device, e.g., the memory device of FIG. 1, in accordance with an embodiment of the present disclosure.

Referring to FIG. 2, the memory device 100 may include a memory cell array 110, a peripheral circuit 120, and control logic 130.

The memory cell array 110 includes a plurality of memory blocks BLK1 to BLKz. The plurality of memory blocks BLK1 to BLKz are coupled to an address decoder 121 through row lines RL. The plurality of memory blocks BLK1 to BLKz are coupled to a read/write circuit 123 through bit lines BL1 to BLm. Each of the plurality of memory blocks BLK1 to BLKz includes a plurality of memory cells. In accordance with an embodiment of the present disclosure, the plurality of memory cells may be nonvolatile memory cells. Among the plurality of memory cells, memory cells coupled to the same word line may be defined as one page, That is, the memory cell array 110 may include a plurality of pages. In accordance with an embodiment of the present disclosure, each of the plurality of memory blocks BLK1 to BLKz in the memory cell array 110 may include a plurality of dummy cells. One or more dummy cells may be coupled in series between a drain select transistor and the memory cells and between a source select transistor and the memory cells.

Each of the memory cells of the memory device 100 may be a single level cell (SLC) for storing one bit of data, a multi-level cell (MLC) for storing two bits of data, a triple level cell (TLC) for storing three bits of data, or a quad level cell (QLC) for storing four bits of data.

The peripheral circuit 120 may include the address decoder 121, a voltage generator 122, the read/write circuit 123, and a data input/output circuit 124.

The peripheral circuit 120 drives the memory cell array 110. For example, the peripheral circuit 120 may driver the memory cell array 110 to perform a program operation, a read operation, and an erase operation.

The address decoder 121 is coupled to the memory cell array 110 through the row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may operate under the control of the control logic 130. The address decoder 121 receives an address ADDR from the control logic 130.

The address decoder 121 may decode a block address in the received address ADDR. The address decoder 121 selects at least one memory block among the memory blocks BLK1 to BLKz according to the decoded block address. The address decoder 121 may decode a row address in the received address ADDR. The address decoder 121 may select at least one word line WL of the selected memory block by applying voltages provided from the voltage generator 122 to the word line WL according to the decoded row address.

In a program operation, the address decoder 121 may apply a program voltage to the selected word line, and apply a pass voltage lower than that of the program voltage to unselected word lines. In a program verify operation, the address decoder 121 may apply a verify voltage to the selected word line, and apply a verify pass voltage higher than the verify voltage to the unselected word lines.

In a read operation, the address decoder 121 may apply a read voltage to the selected word line, and apply a pass voltage higher than the read voltage to the unselected word lines.

In accordance with an embodiment of the present disclosure, an erase operation of the memory device 100 is performed in units of memory blocks. In an erase operation, the address ADDR input to the memory device 100 includes a block address. The address decoder 121 may decode the block address and select one memory block according to the decoded block address. In the erase operation, the address decoder 121 may apply a ground voltage to word lines coupled to the selected memory block.

In accordance with an embodiment of the present disclosure, the address decoder 121 may decode a column address in the address ADDR transmitted thereto. The decoded column address may be transmitted to the read/write circuit 123. In an example, the address decoder 121 may include components such as a row decoder, a column decoder, and an address buffer.

The voltage generator 122 may generate a plurality of voltages by using an external power voltage supplied to the memory device 100. The voltage generator 122 operates under the control of the control logic 130.

In accordance with an embodiment of the present disclosure, the voltage generator 122 may generate an internal power voltage by regulating the external power voltage. The internal power voltage generated by the voltage generator 122 is used as an operation voltage of the memory device 100.

In accordance with an embodiment of the present disclosure, the voltage generator 122 may generate a plurality of voltages by using the external power voltage or the internal power voltage. The voltage generator 122 may be configured to generate various voltages required by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of voltages of various levels, the voltage generator 122 may include a plurality of pumping capacitors for receiving the internal power voltage, and generate a plurality of voltages by selectively activating the plurality of pumping capacitors under the control of the control logic 130. The plurality of generated voltages may be supplied to the memory cell array 110 by the address decoder 121.

In accordance with an embodiment of the present disclosure, the voltage generator 122 may generate operating voltages corresponding to first to nth states (where n is a natural number of 1 or more). Specifically, the voltage generator 122 may generate a program voltage and a pass voltage, which are used in a program operation on memory cells having any one state among the first to nth states. The program voltage and the pass voltage may each have a default value, which may be preset. The voltage generator 122 may generate the program voltage and the pass voltage, each which has a magnitude greater than its default value, under the control of the over-program manager 131.

In accordance with an embodiment of the present disclosure, the voltage generator 122 may generate a verify voltage used in a verify operation on whether a program operation on memory cells has been completed. The voltage generator 122 may generate the verify voltage having a magnitude greater than its default value under the control of the over-program manager 131.

The read/write circuit 123 includes first to mth page buffers PB1 to PBm. The first to mth page buffers PB1 to PBm are coupled to the memory cell array 110 through the respective first to mth bit lines BL1 to BLm. The first to mth page buffers PB1 to PBm operate under the control of the control logic 130.

The first to mth page buffers PB1 to PBm communicate data with the data input/output circuit 124. In a program operation, the first to mth page buffers PB1 to PBm receive data DATA to be stored through the data input/output circuit 124 and data lines DL.

In a program operation, when a program pulse is applied to a selected word line, the first to mth page buffers PB1 to PBm may transfer data DATA received through the data input/output circuit 124 to selected memory cells through the bit lines BL1 to BLm. Memory cells of a selected page are programmed according to the transferred data DATA. A memory cell coupled to a bit line to which a program allow voltage (e.g., a ground voltage) is applied may have an increased threshold voltage. The threshold voltage of a memory cell coupled to a bit line to which a program inhibit voltage (e.g., a power supply voltage) is applied may be maintained. In a program verify operation, the first to mth page buffers PB1 to PBm read page data from the selected memory cells through the bit lines BL1 to BLm.

In a read operation, the read/write circuit 123 may read data DATA from the memory cells of the selected page through the bit lines BL, and store the read data DATA in the first to mth page buffers PB1 to PBm.

In an erase operation, the read/write circuit 123 may float the bit lines BL. In an embodiment, the read/write circuit 123 may include a column select circuit.

The data input/output circuit 124 is coupled to the first to mth page buffers PB1 to PBm through the data lines DL. The data input/output circuit 124 operates under the control of the control logic 130.

The data input/output circuit 124 may include a plurality of input/output buffers (not shown) that receive input data. In a program operation, the data input/output circuit 124 may receive data DATA to be stored from an external controller (e.g., the memory controller 200 of FIG. 1). In a read operation, the data input/output circuit 124 may output, to the external controller, data received from the first to meth page buffers PB1 to PBm included in the read/write circuit 123.

In a read operation or verify operation, a sensing circuit 126 may generate a reference current in response to an allow bit signal generated by the control logic 130, and output a pass signal or fail signal to the control logic 130 by comparing a sensing voltage received from the read/write circuit 123 with a reference voltage generated by the reference current.

The control logic 130 may be coupled to the address decoder 121, the voltage generator 122, the read/write circuit 123, the data input/output circuit 124, and the sensing circuit 126. The control logic 130 may be configured to control overall operations of the memory device 100. The control logic 130 may operate in response to a command CMD received from an external device.

The control logic 130 may control the peripheral circuit 120 by generating various signals in response to the command CMD and the address ADDR. For example, the control logic 130 may generate an operation signal, a row address, a read/write circuit control signal, and an allow bit in response to the command CMD and the address ADDR. The control logic 130 may output the operation signal to the voltage generator 122, output the row address to the address decoder 121, output the read/write circuit control signal to the read/write circuit 123, and output the allow bit to the sensing circuit 126. Also, the control logic 130 may determine whether the verify operation has passed or failed in response to the pass or fail signal output by the sensing circuit 126.

In accordance with an embodiment of the present disclosure, the control logic 130 may further include an over-program manager 131, a status register 132, and a verify operation controller 133.

When the number of over-programmed memory cells exceeds a reference number, the over-program manager 131 may increase operating voltage(s) used in a program operation and/or a verify operation based on the number of over-programmed memory cells. The operating voltages may include at least one of a program voltage, a verify voltage, and a pass voltage.

The status register 132 may store status information. The status information may include information on an operation performed by the memory device 100. The status information may include over-program determination information. The over-program determination information may include over-program status information and offset voltage information.

The verify operation controller 133 may verify whether a program operation on a kth state (where k is a natural number less than n) among a plurality of program states has been completed based on the magnitude of a threshold voltage of memory cells programmed to the kth state. The verify operation controller 133 may count a number of over-programmed memory cells among the memory cells programmed to the kth state. The verify operation controller 133 may provide the counted number of over-programmed memory cells to the over-program manager 131.

FIG. 3 is a diagram illustrating a memory cell array, e.g., memory cell array 110 of FIG. 2, in accordance with an embodiment of the present disclosure.

Referring to FIG. 3, the memory cell array 110 may include first to zth memory blocks BLK1 to BLKz, which are commonly coupled to first to mth bit lines BL1 to BLm. In FIG. 3, for clarity, only components included in the first memory block BLK1 among the plurality of memory blocks BLK1 to BLKz are illustrated. Components included in each of the other memory blocks BLK2 to BLKz are omitted, since each of the other memory blocks BLK2 to BLKz is configured similarly to the first memory block BLK1.

The memory block BLK1 includes a plurality of cell strings CS1_1 to CS1_m. First to mth cell strings CS1_1 to CS1_m are coupled to the first to mth bit lines BL1 to BLm, respectively.

Each of the first to mth cell strings CS1_1 to CS1_m includes a drain select transistor DST, a plurality of memory cells MC1 to MCn coupled in series, and a source select transistor SST. The drain select transistor DST is coupled to a drain select line DSL1. First to nth memory cells MC1 to MCn are coupled to first to nth word lines WL1 to WLn, respectively. The source select transistor SST is coupled to a source select line SSL1. A drain side of the drain select transistor DST is coupled to a corresponding bit line. The drain select transistors of the first to mth cell strings CS1_1 to CS1_m are coupled to the first to mth bit lines BL1 to BLm, respectively. A source side of the source select transistor SST is coupled to a common source line CSL. In an embodiment, the common source line CSL may be commonly coupled to the first to zth memory blocks BLK1 to BLKz.

The drain select line DSL1, the first to nth word lines WL1 to WLn, and the source select line SSL1 are included in the row lines RL of FIG. 2. The drain select line DSL1, the first to nth word lines WL1 to WLn, and the source select line SSL1 are controlled by the address decoder 121. The common source line CSL is controlled by the control logic 130. The first to mth bit lines BL1 to BLm are controlled by the read/write circuit 123.

FIG. 4 is a diagram illustrating a memory cell array, e.g., the memory cell array 110 of FIG. 2, in accordance with an embodiment of the present disclosure.

Referring to FIG. 4, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 5 and 6.

FIG. 5 is a circuit diagram illustrating any one memory block BLKa, among the memory blocks BLK1 to BLKz of FIG. 4, in accordance with an embodiment of the present disclosure.

Referring to FIG. 5, the memory block BLKa may include a plurality of cell strings CS11 to CS1$m$ and CS21 to CS2$m$. In an embodiment, each of the plurality of cell strings CS11 to CS1$m$ and CS21 to CS2$m$ may be formed in a 'U' shape. In the memory block BLKa, m cell strings are arranged in a row direction (i.e., a +X direction). FIG. 5 illustrates two cell strings arranged in a column direction (i.e., a +Y direction). However, this is for clarity; three cell strings may be arranged in the column direction.

Each of the plurality of cell strings CS11 to CS1$m$ and CS21 to CS2$m$ may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is coupled between a common source line CSL and memory cells MC1 to MCp.

In an embodiment, the source select transistors of cell strings arranged on the same row are coupled to a source select line extending in the row direction, and the source select transistors of cell strings arranged on different rows are coupled to different source select lines. In FIG. 5, the source select transistors of the cell strings CS11 to CS1$m$ on a first row are coupled to a first source select line SSL1. The source select transistors of the cell strings CS21 to CS2$m$ on a second row are coupled to a second source select line SSL2.

In another embodiment, the source select transistors of the cell strings CS11 to CS1$m$ and CS21 to CS2$m$ may be commonly coupled to one source select line.

The first to nth memory cells MC1 to MCn of each cell string are coupled between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are coupled in series between the source select transistor SST and the pipe transistor PT. The (p+1)th to nth memory cells MCp+1 to MCn are sequentially arranged in the +Z direction, and are coupled in series between the pipe transistor PT and the drain select transistor DST. The first to pth memory cells MC1 to MCp and the (p+1)th to nth memory cells MCp+1 to MCn are coupled through the pipe transistor PT. Gate electrodes of the first to nth memory cells MC1 to MCn of each cell string are coupled to first to nth word lines WL1 to WLn, respectively.

A gate of the pipe transistor PT of each cell string is coupled to a pipe line PL.

The drain select transistor DST of each cell string is coupled between a corresponding bit line and the memory cells MCp+1 to MCn. Cell strings arranged in the row direction are coupled to a drain select line extending in the row direction. The drain select transistors of the cell strings CS11 to CS1m on the first row are coupled to a first drain select line DSL1. The drain select transistors of the cell strings CS21 to CS2m on the second row are coupled to a second drain select line DSL2.

Cell strings arranged in the column direction are coupled to a bit line extending in the column direction. In FIG. 5, the cell strings CS11 and CS21 on a first column are coupled to a first bit line BL1. The cell strings CS1m and CS2m on an mth column are coupled to an mth bit line BLm.

Memory cells coupled to the same word line in the cell strings arranged in the row direction constitute one page. For example, memory cells coupled to the first word line WL1 in the cell strings CS11 to CS1m on the first row constitute one page. Memory cells coupled to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be coupled to the even bit lines, respectively, and odd-numbered cell strings among the cell strings CS11 to CS1m or CS21 to CS2m arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCp. Alternatively, the dummy memory cell(s) may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the dummy memory cell(s), each may have a required threshold voltage. Before or after an erase operation of the memory block BLKa, a program operation may be performed on all or some of the dummy memory cells. When an erase operation is performed after the program operation is performed, the threshold voltage of the dummy memory cells is controlled by controlling a voltage applied to the dummy word lines coupled to the respective dummy memory cells, so that the dummy memory cells can have the required threshold voltage.

FIG. 6 is a circuit diagram illustrating any one memory block BLKb, among the memory blocks BLK1 to BLKz of FIG. 4, in accordance with another embodiment of the present disclosure.

Referring to FIG. 6, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is coupled between a common source line CSL and the memory cells MC1 to MCn. The source select transistors of cell strings arranged on the same row are coupled to the same source select line. The source select transistors of the cell strings CS11' to CS1m' arranged on a first row are coupled to a first source select line SSL1. Source select transistors of the cell strings CS21' to CS2m' arranged on a second row are coupled to a second source select line SSL2. In another embodiment, the source select transistors of the cell strings CS11' to CS1m' and CS21' to CS2m' may be commonly coupled to one source select line.

The first to nth memory cells MC1 to MCn of each cell string are coupled in series between the source select transistor SST and the drain select transistor DST. Gate electrodes of the first to nth memory cells MC1 to MCn are coupled to first to nth word lines WL1 to WLn, respectively.

The drain select transistor DST of each cell string is coupled between a corresponding bit line and the memory cells MC1 to MCn. The drain select transistors of cell strings arranged in the row direction are coupled to a drain select line extending in the row direction. The drain select transistors of the cell strings CS11' to CS1m' on the first row are coupled to a first drain select line DSL1. The drain select transistors of the cell strings CS21' to CS2m' on the second row are coupled to a second drain select line DSL2.

Consequently, the memory block BLKb of FIG. 6 has a circuit similar to that of the memory block BLKa of FIG. 5, except that the pipe transistor PT is excluded from each cell string in FIG. 6.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be coupled to the even bit lines, respectively, and odd-numbered cell strings among the cell strings CS11' to CS1m' or CS21' to CS2m' arranged in the row direction may be coupled to the odd bit lines, respectively.

In an embodiment, at least one of the first to nth memory cells MC1 to MCn may be used as a dummy memory cell. For example, the dummy memory cell(s) may be provided to decrease an electric field between the source select transistor SST and the memory cells MC1 to MCn. Alternatively, the dummy memory cell(s) may be provided to decrease an electric field between the drain select transistor DST and the memory cells MC1 to MCn. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the dummy memory cell(s), each may have a required threshold voltage. Before or after an erase operation of the memory block BLKb, a program operation may be performed on all or some of the dummy memory cells. When an erase operation is performed after the program operation is performed, the threshold voltage of the dummy memory cells is controlled by controlling a voltage applied to the dummy word lines coupled to the respective dummy memory cells, so that the dummy memory cells can have the required threshold voltage.

FIG. 7 is a diagram illustrating a threshold voltage distribution of memory cells, which is formed by a program operation.

FIG. 8 is a diagram illustrating a program operation of a memory device.

The following description is given in the context in which each of a plurality of memory cells is a multi level cell (MLC) for storing two bits of data. However, the present disclosure is not limited thereto; each of the plurality of memory cells may be a triple level cell (TLC) for storing three bits of data or a quad level cell (QLC) for storing four bits of data.

Referring to FIGS. 7 and 8, an erase state ER may correspond to data '11,' a first program state P1 may correspond to data '10,' a second program state P2 may correspond to data '00,' and a third program state P3 may correspond to data '01.' However, the above-described bit representations is merely an example. Different bit representations may be used to represent the different states.

A program operation of the memory device 100 may include a plurality of program loops PL1 to PLn. That is, the memory device 100 may program selected memory cells to have any one state among the plurality of program states P1, P2, and P3 by performing the plurality of program loops PL1 to PLn.

Each of the plurality of program loops PL1 to PLn may include a program voltage application step (PGM Step) of applying a program pulse and a verify step (Verify Step) of determining whether memory cells have been programmed by applying verify voltages.

For example, when a first program loop PL1 is performed, first to third verify voltages V_vfy1 to V_vfy3 are sequentially applied to verify a program state of a plurality of memory cells after a first program pulse Vpgm1 is applied. Memory cells having the first program state P1 as a target state may be verified by the first verify voltage V_vfy1. Memory cells having the second program state P2 as the target state may be verified by the second verify voltage V_vfy2. Memory cells having the third program state P3 as the target state may be verified by the third verify voltage V_vfy3.

Memory cells that have passed verification (verify-passed) by each of the verify voltages V_vfy1 to V_vfy3 are determined to have the corresponding target state, and then program-inhibited in a second program loop PL2.

More specifically, program pulse is applied to selected word line connected to memory cells including program target memory cells and program inhibit memory cells, But, program inhibit voltage (ex. Power supply voltage) is applied to bit lines connected to the program inhibit memory cells. Program permission voltage (ex. Ground voltage) is applied to bit lines connected to the program target memory cells.

A second program pulse Vpgm2, greater by a unit voltage ΔVpgm than the first program pulse Vpgm1, is applied so as to program the other memory cells except the memory cells program-inhibited in the second program loop PL2. Subsequently, a verify operation is performed identically to that of the first program loop PL1. In an example, a memory cell may be determined as an off-cell by a verify voltage corresponding to the verify pass.

As described above, when the memory device 100 programs the MLC for storing two bits of data, the memory device 100 verifies memory cells having each program state as the target state, using the first to third verify voltages V_vfy1 to V_vfy3.

In the verify step, the verify voltage may be applied to a selected word line that is a word line coupled to the selected memory cells, and a page buffer of the read/write circuit 123 may determine whether the selected memory cells have been verify-passed, based on a current or voltage applied through bit lines respectively coupled to the memory cells, FIG. 9 is a diagram illustrating a threshold voltage distribution of a normal program state.

Referring to FIG. 9, a memory cell may be configured to store at least one bit of data. However, as an example, a case where each of selected memory cells is a multi level cell C for storing two bits of data is assumed and described.

In FIG. 9, the horizontal axis represents threshold voltage of memory cells, and the vertical axis represents number of memory cells. The selected memory cells may be programmed to have a threshold voltage distribution corresponding to any one state among an erase state ER and first to third program states P1 to P3.

In accordance with an embodiment of the present disclosure, a verify voltage corresponding to the first program state P1 is a first verify voltage V_vfy1. A verify voltage corresponding to the second program state P2 is a second verify voltage V_vfy2. A verify voltage corresponding to the third program state P3 is a third verify voltage V_vfy3. The memory device may determine that each of memory cells that have verify-passed among the selected memory cells has a program state corresponding to the verify voltage, using the first to third verify voltages V_vfy1 to V_vfy3.

In accordance with an embodiment of the present disclosure, a first read voltage (V_read1) may be for distinguishing the erase state ER and the first program state P1 from each other. A second read voltage (V_read2) may be for distinguishing the first program state P1 and the second program state P2 from each other. A third read voltage (V_read3) may be for distinguishing the second program state P2 and the third program state P3 from each other. The memory device may read data stored in memory cells, using the first to third read voltages: V_read1 to V_read3.

In the threshold voltage distribution of the normal program state, threshold voltage distributions corresponding to the erase state ER and the first to third program states P1 to P3 have a width narrower than a set width (V_width). V_width may be the maximum value of the width of a threshold voltage distribution capable of ensuring the reliability of the data stored in the memory cells. Thus, a sufficient read margin can be secured between the threshold voltage distributions corresponding to the respective program states. The read margin may be a width where a read voltage is located so as to distinguish two adjacent states among the erase state and the program states.

FIG. 10 is a diagram illustrating a method for determining whether an over-program operation has been performed and controlling operating voltages corresponding to a program state.

Referring to FIG. 10, as an example, a case where each of selected memory cells is a multi level cell (MLC) for storing two bits of data is assumed and described.

The selected memory cells may be programmed to have any one state among an erase state ER and first to third program states P1 to P3. A program operation is an operation of increasing a threshold voltage of a selected memory cell to belong to a threshold voltage range corresponding to a target state of the corresponding memory cell. A verify operation determines whether the threshold voltage of the selected memory cell belongs to the threshold voltage range corresponding to the target state of the corresponding memory cell. Verify pass represents that the selected memory cell is determined as an off-cell by a verify voltage corresponding to the target state. The verify voltage may be the minimum value of a threshold voltage distribution corresponding to the target state.

In the program operation, the memory cells may have a threshold voltage greater than the maximum value of the threshold voltage distribution corresponding to the target state. Among memory cells in the memory device, cells having a threshold voltage greater than the maximum value of the threshold voltage distribution corresponding to the target state may be over-programmed memory cells.

An over-program verify voltage corresponding to an Nth program state (where N is a natural number greater than or equal to 1), i.e., an Nth over-program verify voltage (V_overvfyN), may have a voltage greater by a width V_width than the minimum value of a threshold voltage distribution range corresponding to the Nth program state. In accordance with another embodiment of the present disclosure, the Nth over-program verify voltage (V_overvfyN) may have a voltage greater by V_width than a verify voltage (V_vfyN) that is a default value of the Nth program state.

The memory device may count a number of over-programmed memory cells among memory cells programmed to the Nth program state as a target state. The counting operation may be performed after a verify operation on the Nth program state passes. The over-programmed memory cells may be read as off-cells, using the Nth over-program verify voltage V_overvfyN.

The memory device may determine whether an over-program operation on the Nth program state has been performed based on the number of over-programmed memory cells. When the number of over-programmed memory cells exceeds a reference number, the memory device may determine that the over-program operation on the Nth program state has been performed.

When the over-program operation on the Nth program state is performed, the memory device may set operating voltages corresponding to program states corresponding to threshold voltage distributions greater than those corresponding to the Nth program state. The operating voltages may include a program voltage, a verify voltage, and a pass voltage.

An offset value (Offset) may represent a width shifted from a default value of an operating voltage. In accordance with an embodiment of the present disclosure, operating voltages corresponding to an (N+1)th program state may be increased by respective offset values from their respective default values. The offset value may be determined based on a result obtained by comparing the number of over-programmed memory cells, among the memory cells programmed to the Nth program state as the target state, with reference values of an offset voltage table, which will be described later in FIG. 12.

In FIG. 10, the memory device may count a number (x) of over-programmed memory cells, among memory cells programmed to the first program state P1 as the target state, using a first over-program verify voltage (V_overvfy1). The first over-program verify voltage may be greater by the width (V_width) than the minimum value of a threshold voltage distribution corresponding to the first program state P1. Alternatively, the first over-program verify voltage (V_overvfy1) may be greater by V_width than a default value (V_vfy1) of a verify voltage of the first program state P1.

When the number (x) of over-programmed memory cells exceeds the reference number, the memory device may determine that an over-program operation on the first program state P1 has been performed. When the over-program operation on the first program state P1 is performed, the memory device may set operating voltages corresponding to the second program state P2.

A verify voltage (V_vfy2') of the second program state P2 may have a voltage greater by an offset value (Offset) than a default value (V_vfy2) of a verify voltage of the second program state P2. The offset value may be determined based on a result obtained by comparing the number of over-programmed memory cells, among the memory cells programmed to the first program state P1 as the target state, with the reference values of an offset voltage table, which will be described later in FIG. 12. Therefore, memory cells having the second program state P2 as the target state may be programmed to have a threshold voltage greater than or equal to V_vfy2' of the second program state P2. As a result, a read margin between threshold voltage distributions corresponding to the first program state P1 and the second program state P2 may be secured.

As an example, a case where a verify voltage, among a program voltage, the verify voltage, and a pass voltage, which correspond to the second program state P2, is set will be described. However, the program voltage and the pass voltage may be set in the same manner. That is, since the verify voltage (V_vfy2') of the second program state P2 is increased by the offset value (Offset) from the default value (V_vfy2) of the verify voltage of the second program state P2, the magnitude of a program voltage applied to a selected word line may be increased. An increment of the program voltage may be the offset value. When the program voltage increases, the magnitude of a pass voltage applied to unselected word lines may also be increased. An increment of the pass voltage may be the offset value.

FIG. 11 is a diagram illustrating an operation of an over-program manager, e.g., the over-program manager 131 of the memory device 100 of FIG. 2, in accordance with an embodiment of the present disclosure.

Referring to FIG. 11, the memory device 100 may include control logic 130. The control logic 130 may include the over-program manager 131, a status register 132, a verify operation controller 133, and a program operation controller 134. The over-program manager 131 may include an over-program processor 131a and an offset voltage table 131b.

The over-program processor 131a may determine whether an over-program operation on a kth state (where k is a natural number of 1 or more) has been performed, based on the number of over-programmed memory cells (i.e., memory cells having a threshold voltage greater than a threshold voltage distribution corresponding to the kth state). The kth state may be any one of a plurality of program states. When the number of over-programmed memory cells among memory cells programmed to the kth state as a target state exceeds a reference number, the over-program processor 131a may determine that the over-program operation on the kth state has been performed.

The over-program processor 131a may generate over-program determination information that includes over-program status information and offset voltage information, based on the number of over-programmed memory cells and the offset voltage table 131b.

The over-program status information may represent whether the number of over-programmed memory cells exceeds the reference number. Alternatively, the over-program status information may represent whether the over-program operation on the kth state has been performed.

The offset voltage information may represent the offset value (Offset) described with reference to FIG. 10. The offset value may be determined by comparing the number of over-programmed memory cells with reference values of the offset voltage table 131b. When the number of over-programmed memory cells increases, the offset value may increase.

The over-program processor 131a may provide the generated over-program status information and the generated offset voltage information to the status register 132.

The over-program processor 131a may generate a control signal for the voltage generator 122, based on the generated offset voltage information. The voltage generator 122 may generate operating voltages corresponding to first to nth states (where n is a natural number of 1 or more). The over-program processor 131a may control, through the control signal, the voltage generator 122 to generate operating voltages having magnitudes further increased from a default value. The operating voltages may include at least one of a program voltage, a verify voltage, and a pass voltage.

The offset voltage table 131b may store values representing widths of operating voltages, which are amounts shifted from their default values.

The status register 132 may receive and store over-program determination information generated by the over-program processor 131a. The over-program determination information may include over-program status information and offset voltage information. The status register 132 may store status information. The status information may include information on an operation performed by the memory device 100.

The verify operation controller 133 may acquire a result obtained by reading selected memory cells from the read/write circuit 123 described with reference to FIG. 2, using an over-program verify voltage. Over-programmed memory cells among the selected memory cells may have a threshold voltage greater than the over-program verify voltage. Therefore, the over-programmed memory cells may be read as off-cells when they are read using the over-program verify voltage. On the contrary, memory cells that are not the over-programmed memory cells among the selected memory cells may have a threshold voltage less than the over-program verify voltage. Therefore, the memory cells that are not the over-programmed memory cells may be read as on-cells when they are read using the over-program verify voltage.

The verify operation controller 133 may verify whether a program operation on a kth state among the plurality of program states has been completed, based on the magnitude of a threshold voltage of memory cells programmed to the kth state. A verify voltage used in a verify operation may be supplied from the voltage generator 122.

When the verify operation passes, the verify operation controller 133 may count a number of over-programmed memory cells among the memory cells programmed to the kth state. The over-programmed memory cells may have a threshold voltage greater than a threshold voltage distribution corresponding to the kth state. The over-programmed memory cells may be read as off-cells when they are read using a kth over-program verify voltage (V_overvfyk).

The verify operation controller 133 may provide the counted number of over-programmed memory cells to the over-program processor 131a.

The program operation controller 134 may program the selected memory cells to have any one state among an erase state and a plurality of program states according to data to be stored. The erase state and a plurality of program states may correspond to first to nth states (where n is a natural number of 1 or more), The program operation controller 134 may perform a program operation on each of the selected memory cells to have any one state among the first to nth states. A program voltage and a pass voltage, which are used in the program operation, may be supplied from the voltage generator 122.

FIG. 12 is a diagram illustrating an offset voltage table in accordance with an embodiment of the present disclosure, for example, the offset voltage table 131b of FIG. 11.

Referring to FIG. 12, the offset voltage table 131b may store values representing widths of operating voltages, which are amounts shifted from their default values, when the over-program processor 131a described with reference to FIG. 11 compares a number x of memory cells programmed to the over-program state with a plurality of reference values ref_1 to ref_m (where m is a natural number of 1 or more).

An offset value (Offset) may be determined based on a result obtained by comparing the counted number (x) of over-programmed memory cells with first to mth reference values: ref_1 to ref_m. A particular offset value may have any one voltage shift value among first to mth voltage shift values: V_Shift_1 to V_Shift_m. For example, when the number (x) of over-programmed memory cells is greater than or equal to 0 and is less than the first reference value (ref_1), the offset value has the first voltage shift value V_Shift_1. When the number (x) of over-programmed memory cells is greater than or equal to the first reference value ref_1 and is less than the second reference value (ref_2), the offset value has the second voltage shift value V_Shift_2. More generally, when the number (x) of over-programmed memory cells is greater than or equal to the (m−1)th reference value ref_m−1 and is less than the mth reference value ref_m, the offset value has the mth voltage shift value V_Shift_m.

Each of the first to mth reference values ref_1 to ref_m may be a natural number of 1 or more.

Each of the first to mth voltage shift values (V_Shift_1 to V_Shift_m) may be a value of 0 or more. In another embodiment, some of the first to mth voltage shift values (V_Shift_1 to V_Shift_m) may have negative values. The voltage shift values may gradually increase or decrease in a sequence from the first voltage shift value V_Shift_1 to the mth voltage shift value V_Shift_m.

FIG. 13 is a diagram illustrating a status register, e.g., the status register 132 of FIG. 11, in accordance with an embodiment of the present disclosure.

Referring to FIG. 13, data stored in the status register 132 may include status information and over-program determination information 1303. The status information may include ready information 1301 and fail information 1305.

The ready information 1301 may represent that the memory device is waiting. In accordance with an embodiment of the present disclosure, the ready information 1301 may represent that reception of a new command is possible, and an operation performed in response to a previously received command has been completed. The memory controller 200 of FIG. 1 may check whether the operation performed in response to the previously received command has been completed through the ready information 1301.

The over-program determination information 1303 may include over-program status information and offset voltage information. The over-program state information may be information representing whether the number of over-programmed memory cells exceeds a reference number. The over-program status information may be information representing whether an over-program operation has been performed in a Nth program state (where N is a natural number greater than or equal to 1). When the number of over-programmed memory cells exceeds the reference number, it may be determined that the over-program operation on the Nth program state has been performed. In accordance with an embodiment of the present disclosure, when the over-program operation on the Nth program state is performed, the over-program status information may represent a set state. When the over-program operation on the Nth program state is not performed, the over-program status information may represent a release state.

The offset voltage information may be information representing offset values of operating voltages corresponding to program states corresponding to a threshold voltage distribution greater than that corresponding to the Nth program state, based on the number of over-programmed memory cells among memory cells programmed to the Nth program state as a target state. The offset value may represent a width of an operating voltage, which is shifted from a default value. The operating voltages may include at least one of a program voltage, a verify voltage, and a pass voltage.

The fail information 1305 may represent that an operation corresponding to the previously received command has failed. In accordance with various embodiments of the present disclosure, the fail information 1305 may represent that an operation corresponding to a command received before the most recent command has failed.

FIG. 14 is a diagram illustrating a method for acquiring, in a memory controller 200, over-program determination information in accordance with an embodiment of the present disclosure.

Referring to FIG. 14, the memory controller 200 may provide a program command or erase command to a memory device 100 and then a status read command to the memory device 100 when a preset time elapses.

The status read command may be a command for requesting a value of a status register (e.g., status register 132 of FIG. 11) that stores status information representing an operation state of the memory device 100. Specifically, the memory device 100 may update the status register included in the memory device 100 according to the operation state of the memory device 100.

When the memory device 100 receives the status read command, the memory device 100 may provide the value stored in the status register as a status read response to the memory controller 200 in response to the status read command.

In accordance with an embodiment of the present disclosure, the memory device 100 may generate over-program determination information while the memory device 100 is performing a program operation. The over-program determination information may include over-program status information representing whether an over-program operation has been performed and offset voltage information representing an offset value.

The memory device 100 may provide the memory controller 200 with a status register value including the over-program determination information as the status read response that is a response to the status read command.

FIG. 15 is a diagram illustrating an operation of a bad block manager of a memory controller, e.g., the bad block manager 210 of the memory controller 200 of FIG. 1, in accordance with an embodiment of the present disclosure.

Referring to FIG. 15, the bad block manager 210 may include a bad block table 211, a status read controller 212, and a command controller 213.

The bad block table 211 may include information on a memory block corresponding to a bad block among the plurality of memory blocks included in the memory device 100. The bad block may be a manufacture bad block (MBB) generated when the memory device 100 is manufactured or a growing bad block (GBB) generated when the memory device 100 is used. In accordance with an embodiment of the present disclosure, when memory blocks that store data are read, a memory block in which an uncorrectable error occurs may be a GBB.

When a set time elapses after a program command or erase command is provided to the memory device 100, the status read controller 212 may provide a status read command to the memory device 100.

The status read command may be for requesting a value of a status register that stores status information representing an operation state of the memory device 100. Specifically, the memory device 100 may update the status register 132 of FIG. 11 included in the memory device 100 according to an operation state of the memory device 100. When the memory device 100 receives the status read command, the memory device 100 may provide the memory controller 200 with a value stored in the status register 132 as a status read response in response to the status read command. The status read controller 212 may acquire the status read response from the memory device 100.

The status read controller 212 may determine whether an over-program operation has been performed while a program operation is being performed on selected memory cells of the memory device 100, based on over-program determination information included in the status read response. When the over-program operation is performed while the program operation is being performed, the memory device 100 may add information on a memory block including the selected memory cells to the bad block table 211 or update the information on the memory block including the selected memory cells.

When the over-program operation is performed while the program operation is being performed on the selected memory cells, the status read controller 212 may control the command controller 213 to perform a read operation on the memory block including the selected memory cells and an operation of programming read data in another memory block.

When the over-program operation is performed while the program operation is being performed on the selected memory cells of the memory device 100, the command controller 213 may provide the memory device 100 with a read and program command CMD for moving data stored in the memory block including the selected memory cells to another memory block.

FIG. 16 is a flowchart illustrating an operation of a memory device, e.g., memory device 100 of FIG. 1, in accordance with an embodiment of the present disclosure.

The memory device may perform a program operation on selected memory cells to have any one state among first to nth states (where n is a natural number of 1 or more) distinguished according to the magnitude of a threshold voltage.

Referring to FIG. 16, in step S1601, the memory device may receive a program command for selected memory cells from a memory controller (e.g., memory controller 200 of FIG. 1).

In step S1603, the memory device may perform a program operation and a verify operation on a kth state (where k is a natural number less than n).

In step S1605, the memory device may determine whether the verify operation on the kth state passed. When it is determined that the verify operation on the kth state did not pass (S1605, NO), the memory device proceeds to the step S1603.

When it is determined that the verify operation on the kth state passed (S1605, YES), the memory device proceeds to step S1607.

In the step S1607, the memory device may determine whether the kth state is a last program state on which the program operation is to be performed.

When it is determined that the kth state is the last program state on which the program operation is to be performed (S1607, YES), the memory device proceeds to step S1609.

When it is determined that the kth state is not the last program state on which the program operation is to be performed (S1607, NO), the memory device proceeds to step S1611.

In the step S1609, the memory device may input, to a status register (e.g., status register 132 of FIG. 11), ready information or fail information on the program operation to be performed, and end the operation.

In the step S1611, the memory device may determine whether an over-program operation has been performed while the program operation on the kth state is being performed.

When it is determined that the over-program operation has been performed (S1611, YES), the memory device proceeds to step S1615.

When it is determined that the over-program operation has not been performed (S1611, NO), the memory device proceeds to step S1613.

In the step S1613, the memory device increments k, and proceed to step S1603 for a (k+1)th state.

In the step S1615, the memory device may input over-program determination information to the status register. In step S1617, the memory device increments k, and proceed to step S1619 for the (k+1)th state.

In the step S1619, the memory device may control operating voltages corresponding to the (k+1)th state, based on the over-program determination information. The operating voltages may include at least one of a program voltage, a verify voltage, and a pass voltage.

FIG. 17 is a flowchart illustrating an operation of a memory controller, e.g., memory controller 200 of FIG. 1, in accordance with an embodiment of the present disclosure.

The memory controller may control overall operations of a memory device, e.g., memory device 100 of FIG. 1, including a plurality of memory cells.

Referring to FIG. 17, in step S1701, the memory controller may provide a program command to the memory device to perform a program operation on selected memory cells.

In step S1703, the memory controller may provide a status read command to the memory device.

In step S1705, the memory controller may receive a status read response from the memory device.

In step S1707, the memory controller may determine whether the program operation has been completely performed, based on the status read response from the memory device. When it is determined that the program operation has not been completely performed (S1707, NO), the memory controller proceeds to the step S1703. When it is determined that the program operation has been completely performed (S1707, YES), the memory controller proceeds to step S1709.

In the step S1709, the memory controller may determine whether an over-program operation has been performed. When it is determined that the over-program operation has not been performed (S1709, NO), the memory controller ends the operation. When it is determined that the over-program operation has been performed (S1709, YES), the memory controller proceeds to step S1711.

In the step S1711, the memory controller may control the memory device to read a memory block on which the program operation has been performed, which is a memory block including the selected memory cells, based on over-program determination information included in the status read response.

In step S1713, the memory controller may control the memory device to program data of the read memory block in another memory block.

In step S1715, the memory controller may process, as a bad block, the memory block on which the program operation has been performed.

FIG. 18 is a flowchart illustrating an operation of a storage device, e.g., storage device 50 of FIG. 1, which includes memory device 100 and memory controller 200, in accordance with an embodiment of the present disclosure.

Referring to FIG. 18, in step S1801, the memory controller 200 may provide a program command to the memory device 100. When doing so, the memory controller 200 may provide a program address representing a memory area to be programmed and program data that is data to be programmed. The memory area to be programmed may represent selected memory cells to be programmed.

In step S1803, the memory device 100 may determine whether an over-program operation on a kth state (where k is a natural number of 1 or more), among a plurality of states, has been performed. In other words, the memory device 100 may sense whether, and which, memory cells have been over-programmed while a program operation is being performed. Specifically, the memory device 100 may count a number of over-programmed memory cells. When the number of over-programmed memory cells exceeds a reference number, the memory device 100 may determine that the over-program operation has been performed. In accordance with another embodiment of the present disclosure, the memory device 100 may read the selected memory cells, using an over-program verify voltage corresponding to the kth state, and determine whether the over-program operation has been performed when the number of over-programmed memory cells exceeds the reference number.

In step S1805, the memory device 100 may store over-program determination information in a status register (e.g., status register 132 of FIG. 11). The over-program determination information may include over-program status information and offset voltage information. For example, the memory device 100 may store, in the status register, the over-program status information indicating a set state or release state and the offset voltage information representing the offset value (Offset) described with reference to FIGS. 10 and 12.

In step S1807, the memory controller 200 may determine whether a set time (e.g., program time tPROG) has elapsed. When it is determined that the set time has elapsed, the memory controller 200 may provide a status read command to the memory device 100 in step S1809.

In step S1811, the memory device 100 may provide the memory controller 200 with a value stored in the status register as a status read response.

In step S1813, the memory controller 200 may determine whether a program operation has been completely performed based on status information included in the status read response provided by the memory device 100. The status information may include ready information, over-program determination information, and fail information. The memory controller 200 may determine whether the memory device 100 has completely performed the program operation based on the ready information.

In step S1815, the memory controller 200 may determine whether an over-program operation has been performed based on over-program status information in the over-program determination information included in the status information.

In step S1817, the memory controller 200 may perform a bad block processing and data movement operation based on whether the over-program operation has been performed.

For example, when the over-program operation is performed, the memory controller 200 may control the memory device 100 to read a memory block on which the program operation has been performed, which is a memory block including the selected memory cells, and program data of the read memory block in another memory block. The memory controller 200 may add information on the memory block on which the program operation has been performed to the bad block table or update the information on the memory block on which the program operation has been performed. When the over-program operation is not performed, the memory controller 200 ends the operation.

FIG. 19 is a diagram illustrating a memory controller, e.g., the memory controller 200 of FIG. 1, in accordance with another embodiment of the present disclosure.

Referring to FIG. 19, the memory controller 1000 is coupled to a host (e.g., a host 300 of FIG. 1) and a memory device (e.g., a memory device 100 of FIG. 1). The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction code (ECC) circuit 1030, a host interface 1040, a buffer control circuit 1050, a memory interface 1060, and a bus 1070.

The bus 1070 may be configured to provide channels between components of the memory controller 1000.

The processor 1010 may control overall operations of the memory controller 1000, and perform a logical operation. The processor 1010 may communicate with the host through the host interface 1040, and communicate with the memory device through the memory interface 1060. Also, the processor 1010 may communicate with the memory buffer 1020 through the buffer control circuit 1050. The processor 1010 may control an operation of a storage device including the memory device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA, using a mapping table, to be translated into a PBA. Several address mapping methods of the FTL exist according to mapping units, for example, a page mapping method, a block mapping method, and a hybrid mapping method. Any of these mapping methods may be used.

The processor 1010 is configured to randomize data received from the host. For example, the processor 1010 may randomize data received from the host, using a randomizing seed. The randomized data is provided as data to be stored to the memory device to be programmed in the memory cell array.

In a read operation, the processor 1010 is configured to derandomize data received from the memory device. For example, the processor 1010 may derandomize data received from the memory device, using a derandomizing seed. The derandomized data may be output to the host.

In an embodiment, the processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a static random access memory (RAM) (SRAM) or a dynamic RAM (DRAM).

The ECC circuit 1030 may perform an ECC operation. The ECC circuit 1030 may perform ECC encoding on data to be written in the memory device through the memory interface 1060. The ECC encoded data may be transferred to the memory device through the memory interface 1060. The ECC circuit 1030 may perform ECC decoding on data received from the memory device through the memory interface 1060. In an example, the ECC circuit 1030 may be included as a component of the memory interface 1060 in the memory interface 1060.

The host interface 1040 may communicate with the external host under the control of the processor 1010. The host interface 1040 may communicate with the host, using at least one of various communication protocols, such as a universal serial bus (USB), a serial AT attachment (SATA), a high speed interchip (HSIC), a small computer system interface (SCSI), Firewire, a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050. One or both of the memory buffer 1020 and the buffer control circuit 1050 may be provided separately or its/their functions distributed within the memory controller 1000.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other so as not to interfere with, or influence, each other. The data bus may be coupled to the ECC circuit 1030, the host interface 1040, the buffer control circuit 1050, and the memory interface 1060. The control bus may be coupled to the processor 1010, the memory buffer 1020, the host interface 1040, the buffer control circuit 1050, and the memory interface 1060.

FIG. 20 is a block diagram illustrating a memory card system 2000 to which a storage device is applied in accordance with an embodiment of the present disclosure.

Referring to FIG. 20, the memory card system 2000 includes a memory controller 2100, a memory device 2200, and a connector 2300.

The memory controller 2100 is coupled to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to driver firmware for controlling the memory device 2200. The memory controller 2100 may be implemented identically to the memory controller 200 described with reference to FIG. 1.

In an example, the memory controller 2100 may include components such as a random access memory (RAM), a processor, a host interface, a memory interface, and an error correction code (ECC) circuit.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a universal serial bus (USB), a multi-media card (MMC) an embedded MMC (eMMC), a peripheral component interconnection (PCI), a PCI express (PCIe), an advanced technology attachment (ATA), a serial-ATA (SATA), a parallel-ATA (DATA), a small computer system interface (SCSI), an enhanced small disk interface (ESDI), an integrated drive electronics (IDE), firewire, a universal flash storage (UFS), Wi-Fi, Bluetooth, and NVMe.

In an example, the memory device 2200 may be implemented with various nonvolatile memory devices such as an electrically erasable and programmable ROM (EPROM), a NAND flash memory, a NOR flash memory, a phase-change RAM (PRAM), a resistive RAM (ReRAM), a ferroelectric RAM (FRAM), and a spin torque transfer magnetic RAM (STT-MRAM).

The memory controller 2100 and the memory device 2200 may be integrated into a single semiconductor device, to constitute a memory card such as a PC card (e.g., personal computer memory card international association (PCM-CIA)), a compact flash (CF) card, a smart media card (e.g., SM and SMC), a memory stick, a multi-media card (e.g., MMC, RS-MMC, MMCmicro and eMMC), a secure digital (SD) card (e.g., SD, miniSD, microSD and SDHC), and/or a universal flash storage (UFS).

FIG. 21 is a block diagram illustrating a solid state drive (SSD) system 3000 to which a storage device is applied in accordance with an embodiment of the present disclosure.

Referring to FIG. 21, the SSD system 3000 includes a host 3100 and an SSD 3200. The SSD 3200 exchanges a signal SIG with the host 3100 through a signal connector 3001, and receives power PWR through a power connector 3002. The SSD 3200 includes an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be based on an interface between the host 3100 and the SSD 3200. For example, the signal SIG may be defined by at least one of interfaces such as a universal serial bus (USB), multi-media card (MMC) an embedded MMC (eMMC), a peripheral component interconnection (PCI), a PCI express (PCIe), an advanced technology attachment (ATA), a serial-ATA (SATA), a parallel-ATA (PATA), a small computer system interface (SCSI), an enhanced small disk interface (ESDI), an integrated drive electronics (IDE), a firewire, a universal flash storage (UFS), a WI-FI, a Bluetooth, and an NVMe.

The auxiliary power supply 3230 is coupled to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located externally to the SSD 3200. For example, the auxiliary power supply 3230 may be located on a main board, and provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a dynamic random access memory (DRAM), a synchronous DRAM (SDRAM), a double data rate (DDR) SDRAM, a low power DDR (LPDDR) SDRAM, and a graphic RAM (GRAM) or nonvolatile memories such as a ferroelectric random access memory (FRAM), a resistive RAM (ReRAM), a spin transfer torque random access memory (STT-MRAM), and a phase-change random access memory (PRAM).

FIG. 22 is a block diagram illustrating a user system 4000 to which a storage device is applied in accordance with an embodiment of the present disclosure.

Referring to FIG. 22, the user system 4000 may include an application processor 4100, a memory module 4200, a network module 4300, a storage module 4400, and a user interface 4500.

The application processor 4100 may drive components included in the user system 4000, such as an operating system (OS), a user program, or the like. In an example, the application processor 4100 may include controllers for controlling components included in the user system 4000, interfaces, a graphic engine, and the like. The application processor 4100 may be provided as a system-on-chip (SoC).

The memory module 4200 may operate as a main memory, working memory, buffer memory or cache memory of the user system 4000. The memory module 4200 may include volatile random access memories such as a dynamic random access memory (DRAM), a synchronous DRAM (SDRAM), a double data rate (DDR) SDRAM, a DDR2 SDRM, a DDR3 SDRAM, a low power DDR (LPDDR) SDRAM, an LPDDR2 SDRAM, and an LPDDR3 SDRAM or nonvolatile random access memories such as a phase-change random access memory (PRAM), a resistive RAM (ReRAM), a magnetoresistive RAM (MRAM), and a ferroelectric RAM (FRAM). In an example, the application processor 4100 and the memory module 4200 may be provided as one semiconductor package by being packaged based on a package on package (PoP).

The network module 4300 may communicate with external devices. In an example, the network module 4300 may support wireless communications such as code division multiple access (CDMA), global system for mobile communication (GSM), wideband CDMA (WCDMA), CDMA-2000, time division multiple access (TDMA), long term evolution (LTE), world interoperability for microwave access (WiMAX), wireless local area network (WLAN), ultra-wideband (UWB), Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a phase-change random access memory (RAM) (PRAM), a magnetic RAM (MRAM), a resistive RAM (RRAM), a NAND flash, a NOR flash, or a NAND flash having a three-dimensional structure. In an example, the storage module 4400 may be provided as a removable drive such as a memory card of the user system 4000 or an external drive.

For example, the storage module 4400 may include a plurality of nonvolatile memory devices, and the plurality of nonvolatile memory devices may operate identically to the memory device 100 described with reference to FIG. 2. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a liquid crystal display (LCD), an organic light emitting diode (OLED) display device, an active matrix OLED (AMOLED) display device, an LED, a speaker, and a motor.

In accordance with embodiments of the present disclosure, a storage device having improved reliability and an operating method thereof are provided.

While the present disclosure has been illustrated and described with reference to embodiments thereof, it will be understood by those skilled in the art in light of the present disclosure that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The disclosed embodiments are only examples to facilitate an understanding of, but not limit, the present invention. That is, it should be apparent to those skilled in the art that various modifications can be made on the basis of the technological scope of the present disclosure.

Although specific terminologies are used here, they are used to explain, not limit, the embodiments of the present disclosure. Many variations and modifications are possible within the spirit and scope of the present disclosure, as those skilled in the art will recognize from the technological scope of the present disclosure in addition to the embodiments disclosed herein.

What is claimed is:

1. A memory device comprising:
  a memory cell array including memory cells;
  a program operation controller configured to perform a program operation on the memory cells to any one state among first to nth states, wherein n is a natural number greater than 1, distinguished according to their threshold voltages;
  a voltage generator configured to generate operating voltages respectively corresponding to the first to nth states in the program operation;
  a verify operation controller configured to verify whether the program operation performed on selected memory cells to a kth state, wherein k is a natural number less than n, has been completed, and count a number of over-programmed memory cells having a threshold voltage greater than a threshold voltage corresponding to the kth state among the selected memory cells; and
  an over-program manager configured to increase operating voltages respectively corresponding to (k+1)th to nth states to be greater than respectively corresponding default values according to the number of over-programmed memory cells.

2. The memory device of claim 1, wherein the over-program manager includes an offset voltage table configured to store offset values representing widths shifted from the default values for the operating voltages according to the number of over-programmed memory cells.

3. The memory device of claim 2, wherein the over-program manager includes an over-program processor configured to generate over-program status information representing whether the number of over-programmed memory cells exceeds a reference number.

4. The memory device of claim 3, wherein, when the number of over-programmed memory cells exceeds the reference number, the over-program processor generates offset voltage information representing information on offset values of the operating voltages respectively corresponding to the (k+1)th to nth states based on the offset voltage table.

5. The memory device of claim 4, further comprising a status register configured to store the over-program status information and the offset voltage information.

6. The memory device of claim 5, wherein the status register stores status information on the memory device,
  wherein the status information includes ready information representing that reception of a new command is possible, and an operation performed in response to a previously received command has been completed, the over-program status information, the offset voltage information, and fail information representing that an operation corresponding to the previously received command has failed.

7. The memory device of claim 4, wherein the over-program processor controls the magnitudes of the operating voltages respectively corresponding to the (k+1)th to nth states based on the offset voltage information.

8. The memory device of claim 1, wherein the operating voltages includes at least one voltage among a verify voltage, a program voltage, and a pass voltage.

9. A storage device comprising:
a memory device configured to increase voltages used in a program operation and a verify operation on memory cells in (k+1)th to nth states, wherein n is a natural number greater than 1 and k is a natural number less than n, according to a number of over-programmed cells having a threshold voltage greater than a threshold voltage corresponding to a kth state, among selected memory cells programmed to the kth state; and
a memory controller configured to process a memory block including the selected memory cells as a bad block, when the number of over-programmed memory cells exceeds a reference number.

10. The storage device of claim 9, wherein the memory controller includes a bad block manager configured to read data of the memory block including the selected memory cells, and program the read data in another memory block.

11. The storage device of claim 10, wherein the bad block manager reads the data of the memory block including the selected memory cells by adjusting a default read voltage value according the number of over-programmed memory cells.

12. The storage device of claim 10, wherein the bad block manager includes a bad block table configured to store information on bad memory blocks among a plurality of memory blocks included in the memory device,
wherein, when the number of over-programmed memory cells exceeds the reference number, the bad block manager adds or updates information on the memory block including the selected memory cells to the bad block table.

13. A method for operating a memory device including a plurality of memory blocks each including a plurality of memory cells, the method comprising:

performing a program operation on selected memory cells to a kth state, among first to nth states, wherein k is a natural number less than n and n is a natural number greater than 1;
generating operating voltages respectively corresponding to the first to nth states in the program operation;
performing a verify operation on the selected memory cells;
when the verify operation passes, counting a number of over-programmed memory cells having a threshold voltage greater than a threshold voltage corresponding to the kth state; and
increasing operating voltages respectively corresponding to (k+1)th to nth states, among the operating voltages, to be greater than respective default values according to the number of over-programmed memory cells.

14. The method of claim 13, wherein the increasing of the operating voltages includes generating over-program status information representing whether the number of over-programmed memory cells exceeds a reference number.

15. The method of claim 14, wherein the increasing of the operating voltages includes, when the number of over-programmed memory cells exceeds the reference number, generating offset voltage information representing information on offset values representing widths shifted from respective default values for the operating voltages respectively corresponding to the (k+1)th to nth states, based on the number of over-programmed memory cells.

16. The method of claim 15, wherein, in the increasing of the operating voltages, the operating voltages respectively corresponding to the (k+1)th to nth states are adjusted based on the offset voltage information.

17. The method of claim 15, wherein the offset values increase when the number of over-programmed memory cells increases.

18. The method of claim 15, further comprising storing the over-program status information and the offset voltage information in a status register.

19. The method of claim 18, further comprising providing the information stored in the status register to a memory controller.

20. The method of claim 13, wherein the operating voltages includes at least one voltage among a verify voltage, a program voltage, and a pass voltage.

* * * * *